United States Patent
Seta et al.

(10) Patent No.: US 6,627,557 B2
(45) Date of Patent: Sep. 30, 2003

(54) SEMICONDUCTOR DEVICE AND METHOD FOR MANUFACTURING THE SAME

(75) Inventors: Shoji Seta, Yokohama (JP); Takaya Matsushita, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 50 days.

(21) Appl. No.: 09/819,770

(22) Filed: Mar. 29, 2001

(65) Prior Publication Data

US 2001/0029105 A1 Oct. 11, 2001

(30) Foreign Application Priority Data

Mar. 31, 2000 (JP) .......................... 2000-099760

(51) Int. Cl.[7] ....................... H01L 21/302; H01L 21/461
(52) U.S. Cl. ................. 438/717; 438/736; 438/780; 438/637
(58) Field of Search ................. 438/424, 425, 438/427, 587, 618, 622, 637, 638, 672, 675, 687, 700, 735, 736, 738, 942, 706–725, 734–744

(56) References Cited

U.S. PATENT DOCUMENTS 6,331,462 B1 * 12/2001 Kasaoka et al. ............ 438/253
6,346,474 B1 * 2/2002 Liu ............................ 438/633
6,395,632 B1 * 5/2002 Farrar ........................ 438/687

FOREIGN PATENT DOCUMENTS

| JP | 08-279488 | 10/1996 |
| JP | 10-274620 | 10/1998 |
| JP | 11-168105 | 6/1999 |
| JP | 12-077618 | 3/2000 |

OTHER PUBLICATIONS

Chang et al, ULSI Technology, McGraw–Hill, 1996, p. 290.*

* cited by examiner

Primary Examiner—Matthew Smith
Assistant Examiner—Calvin Lee
(74) Attorney, Agent, or Firm—Finnegan, Henderson, Farabow, Garrett & Dunner, L.L.P.

(57) ABSTRACT

Disclosed is a method of manufacturing a semiconductor device, which comprises the steps of forming an insulating film or a metal film on a surface of a semiconductor substrate, forming at least two kinds of mask on a surface of the insulating film or the metal film, and performing a plurality of etching works to the insulating film or the metal film in conformity with the various kinds of mask.

38 Claims, 27 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2000-099760, filed Mar. 31, 2000, the entire contents of which are incorporated herein by reference.

BACKGROUND OF THE INVENTION

This invention relates to a method for manufacturing a semiconductor device by means of dry etching. In particular, the present invention relates to a method of forming a mask to be used for working an underlying layer, and to a method of etching by making use of the mask. This invention also relates to a semiconductor device to be formed by making use of this etching method.

Today, there is an increasing demand to further miniaturize the pattern of semiconductor elements due to an increasing integration of the semiconductor devices. Further, in view of further accelerating the response speed of the semiconductor devices, there has been tried to reduce the wiring resistance or the parasitic resistance of wiring. Meantime, the patterning of photoresist film has been performed by making use of a reflection preventive film which is formed directly below the photoresist film.

A dual damascene work is now extensively adopted in the technique of manufacturing a semiconductor device, wherein wiring grooves and contact holes associated with the wiring grooves are formed in an interlayer insulating film, and then, metallic wirings and contact plugs were buried in these grooves and holes, respectively. There are two possible alternative methods for carrying out the dual damascene work, i.e. a method wherein the contact holes are formed at first, and then, the wiring grooves are formed so as to overlap the contact holes (holes first, grooves later), and a method wherein the wiring grooves are formed at first, and then, the contact holes are formed therein (grooves first, holes later).

In the method where the wiring grooves are formed in advance in the aforementioned manufacturing method of semiconductor device, since the patterning of the contact holes are performed after the working of wiring grooves, the DOF (Depth of Focus) is caused to decrease due to the influence of the step portion of the grooves, so that as the patterning size decreases, it becomes increasingly difficult to perform a satisfactory patterning. On the other hand, in the method where the contact holes are formed in advance, since the patterning of the wiring grooves are performed after the working of contact holes, a reflection preventive film and a resist (photoresist) are caused to enter into the contact holes.

Meantime, since the resist film is required to be formed thinner in conformity with the increasing miniaturization of semiconductor device today, it is indispensable to secure a high etching selectivity between the resist film and an interlayer insulating film on the occasion of the etching work of the wiring grooves. Therefore, the reflection preventive film and the resist that have been entered into the contact holes act as a mask for the sidewalls of contact holes, thereby giving rise to the generation of residue of the interlayer insulating film on the surface of contact holes on the occasion of forming the wiring grooves. This generation of residue of the interlayer insulating film leads to a deterioration of reflow characteristics of the wiring material, and also to a cause for giving a bad influence to the electric characteristics of semiconductor device.

Further, in a situation where a portion of a semiconductor chip is subjected to a dual damascene work, and the other portion thereof is subjected to the work for forming the contact holes of high aspect ratio, since the patterning in the dual damascene work is required to be repeated at least twice, the misregistration of lithography is liable to be generated in the operation of forming the contact holes of high aspect ratio at the aforementioned other portion of the semiconductor chip. Additionally, a reflection preventive film and a resist may enter into the contact holes on the occasion of the second patterning process, thereby allowing the resist to act as a mask to make it difficult to satisfactory perform the working.

As the wirings to be formed in a semiconductor device becomes increasingly finer, the width between wirings becomes increasingly narrower. As a result, the wiring resistance is caused to increase, thereby raising the problem that the propagation velocity of signals becomes lower. As explained above, in the case of the dual damascene work, as the pattern to be formed therein becomes increasingly finer, the resist film is also required to be thinner, so that the etching is required to be performed using an interlayer insulating film having a higher etching selectivity relative to the resist film. As a result, the residue of the interlayer insulating film is caused to remain on an upper portion of contact holes on the occasion of forming the wiring grooves. This residue of the interlayer insulating film leads to a deterioration of reflow characteristics of the wiring material, and also to a cause for deteriorating the electric characteristics of semiconductor device.

In a situation where a pattern is desired to be formed on each of different kinds of film (mixed films) which have been formed in advance on the surface of a semiconductor chip, i.e. an interlayer insulating film has been formed on a portion of the surface of the semiconductor chip, while a polysilicon film has been formed on another portion of the surface of the semiconductor chip, the pattern-forming process including patterning and RIE is required to be separately performed for each kind of films, resulting in an increase in the number of steps and in deterioration of productivity.

Further, in order to make it possible to perform the fine working of a semiconductor, a reflection preventive film is formed prior to the step of forming a pattern using a resist on the occasion of working an insulating film or a metallic film. In this case, since the portion where wirings are densely located (densified portion) differs in terms of DOF (Depth of Focus) from the portion where wirings are sparsely located (sparse portion), if an isolated wiring is to be formed, the densified portion would be under-dosed, thereby rendering the wiring of this densified portion to become tapered in cross-section. On the other hand, if wirings of high-density is to be formed, the sparse portion would be over-dosed, thereby leading to the generation of skipping of pattern where the pattern in the sparse portion is failed to be formed.

BRIEF SUMMARY OF THE INVENTION

This invention has been achieved under the circumstances mentioned above, and therefore, an object of the present invention is to provide a method of manufacturing a semiconductor device, which is capable of excellently controlling the various shapes of patterns which differ depending on the region in a semiconductor chip.

Another object of the present invention is to provide a semiconductor device having precise patterns formed therein.

A still another object of the present invention is to provide a method of manufacturing a semiconductor device, which enables patterns to be worked with excellent controllability even if a film having different kinds of underlying layer is formed thereon.

Namely, the present invention is featured in that the work to form a resist mask is performed after a hard mask layer is subjected to the masking work thereof, thereby incorporating all of the hard mask into the resist; or in that the region where the resist mask exists is formed at a portion of a semiconductor chip, and the region where the hard mask exists is formed at another portion of the semiconductor chip. As a result, it becomes possible to excellently control the various shapes of patterns which differ depending on the region in a semiconductor chip, and to enable patterns to be worked with excellent controllability even if a film having different kinds of underlying layer is formed thereon.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

According to a first aspect of the present invention, there is provided a method of manufacturing a semiconductor device, which comprises the steps of: forming an insulating film or a metal film on a surface of a semiconductor substrate; forming at least two kinds of mask on a surface of the insulating film or the metal film; and performing a plurality of etching works to the insulating film or the metal film in conformity with the various kinds of mask.

In the manufacturing method according to the first aspect of the present invention, the at least two kinds of mask may be a hard mask and a carbon-containing mask, respectively.

In the manufacturing method according to the first aspect of the present invention, wherein the at least two kinds of mask are a hard mask and a carbon-containing mask, respectively, the hard mask may be covered with the carbon-containing mask.

In the manufacturing method of according to the first aspect of the present invention, wherein the at least two kinds of mask are a hard mask and a carbon-containing mask, respectively, when the insulating film is to be worked, the hard mask to be employed may be formed of an insulating film which is different from the first mentioned insulating film or a metal film; and when the metal film is to be worked, the hard mask to be employed may be formed of an insulating film.

In the manufacturing method of according to the first aspect of the present invention, wherein the at least two kinds of mask are a hard mask and a carbon-containing mask, respectively, the carbon-containing film may be formed of a material selected from the group consisting of a resist, a low dielectric constant insulating film, and carbon film.

According to a second aspect of the present invention, there is provided a method of manufacturing a semiconductor device, which comprises the steps of: forming an insulating film or a metal film on a surface of a semiconductor substrate; forming a hard mask on a surface of the insulating film or the metal film; forming a carbon-containing film on the insulating film or the metal film having the hard mask formed thereon, which is followed by a patterning work of the carbon-containing film, the resultant pattern of the carbon-containing film being subsequently employed as a mask to perform a first etching work of the insulating film or the metal film; and removing the patterned carbon-containing film, which is followed by a second etching work of the insulating film or the metal film with the hard mask being employed as a mask.

In the manufacturing method according to the second aspect of the present invention, a metal film or a film of insulating material which differs from the insulating film may be buried in the insulating film to be subjected to the etching work.

In the manufacturing method according to the second aspect of the present invention, the process of patterning the carbon-containing film may comprise the steps of: successively forming an SOG film and a resist film on a surface of the carbon-containing film; patterning the resist film, and working the SOG film with the patterned resist film being employed as a mask; and etching the carbon-containing film with this worked SOG film being employed as a mask.

In the manufacturing method according to the second aspect of the present invention, wherein the process of patterning the carbon-containing film comprises the steps of: successively forming an SOG film and a resist film on a surface of the carbon-containing film; patterning the resist film, and working the SOG film with the patterned resist film being employed as a mask; and etching the carbon-containing film with this worked SOG film being employed as a mask, the patterning process may further comprise a step of forming a reflection preventive film on the SOG film.

According to a third aspect of the present invention, there is provided a method of manufacturing a semiconductor device, which comprises the steps of: forming an insulating film on a surface of a semiconductor substrate; forming a film of hard mask on a surface of the insulating film, and patterning the film of hard mask to obtain a hard mask; forming a carbon-containing film on the insulating film having the hard mask formed thereon, which is followed by a patterning work of the carbon-containing film to remove part of the carbon-containing film which is located in a first region of the semiconductor substrate to thereby obtain a patterned carbon-containing film which is located in a second region of the semiconductor substrate, thereby forming a mask; subjecting the insulating film to a first etching work with the hard mask of the first region and the mask of the second region being employed as a mask; removing the carbon-containing film located in the second region; and subjecting the insulating films of the first and second regions to a second etching work with the hard mask being employed as a mask.

In the manufacturing method according to the third aspect of the present invention, the hard mask may be formed of a film of an insulating material which is different from the insulating film or a metal film.

In the manufacturing method according to the third aspect of the present invention, the carbon-containing film may be formed of a material selected from the group consisting of a resist, a low dielectric constant insulating film, and carbon film.

In the manufacturing method according to the third aspect of the present invention, a metal film may be buried in the insulating film to be subjected to the etching work.

In the manufacturing method according to the third aspect of the present invention, the process of patterning the carbon-containing film may comprise the steps of: successively forming an SOG film and a resist film on a surface of the carbon-containing film; patterning the resist film, and working the SOG film with the patterned resist film being employed as a mask; and etching the carbon-containing film with this worked SOG film being employed as a mask.

In the manufacturing method according to the third aspect of the present invention, wherein the process of patterning the carbon-containing film comprises the steps of: successively forming an SOG film and a resist film on a surface of the carbon-containing film; patterning the resist film, and working the SOG film with the patterned resist film being employed as a mask; and etching the carbon-containing film with this worked SOG film being employed as a mask, the patterning process may further comprise a step of forming a reflection preventive film on the SOG film.

In the manufacturing method according to the third aspect of the present invention, the manufacturing method may further comprise a step of burying a metal film in the wiring grooves and contact holes which are formed in the first and second etching works.

According to a fourth aspect of the present invention, there is provided a method of manufacturing a semiconductor device, which comprises the steps of: forming a first insulating film on a surface of a semiconductor substrate; forming a film of hard mask on a surface of the first insulating film, and patterning the film of hard mask to obtain a hard mask; forming a carbon-containing film on the first insulating film having the hard mask formed thereon, which is followed by a patterning work of the carbon-containing film to form a mask; subjecting the first insulating film to a first etching work with the mask of carbon-containing film being employed as a mask; removing the mask of carbon-containing film; subjecting the first insulating film to a second etching work with the hard mask being employed as a mask; burying a metal film in the wiring grooves provided with contact holes and in the contact holes which are formed in the first and second etching works; forming a second insulating film on the first insulating film in which the metal film is buried; forming wiring grooves in the second insulating film, the wiring grooves allowing prescribed contact plugs that have been formed in the first insulating film to expose; and burying metal wirings in the wiring grooves formed in the second insulating film.

In the manufacturing method according to the fourth aspect of the present invention, the patterning may be performed in a manner to allow the wiring grooves and the contact holes to be disposed alternately.

In the manufacturing method according to the fourth aspect of the present invention, the carbon-containing film may be formed of a material selected from the group consisting of a resist, a low dielectric constant insulating film, and carbon film.

In the manufacturing method according to the fourth aspect of the present invention, the process of patterning the carbon-containing film may comprise the steps of: successively forming an SOG film and a resist film on a surface of the carbon-containing film; patterning the resist film, and working the SOG film with the patterned resist film being employed as a mask; and etching the carbon-containing film with this worked SOG film being employed as a mask.

In the manufacturing method according to the fourth aspect of the present invention, wherein the process of patterning the carbon-containing film comprises the steps of: successively forming an SOG film and a resist film on a surface of the carbon-containing film; patterning the resist film, and working the SOG film with the patterned resist film being employed as a mask; and etching the carbon-containing film with this worked SOG film being employed as a mask, the patterning process may further comprise a step of forming a reflection preventive film on the SOG film.

According to a fifth aspect of the present invention, there is provided a method of manufacturing a semiconductor device, which comprises the steps of: forming an insulating film on a surface of a semiconductor substrate; forming a metal film in a predetermined region of the insulating film; forming a film of hard mask on the surfaces of the insulating film and the metal film, and patterning the film of hard mask to obtain a hard mask; forming a carbon-containing film on the insulating film and the metal film each having the hard mask formed thereon, which is followed by a patterning work of the carbon-containing film to form a mask; subjecting the insulating film to a first etching work with the mask of carbon-containing film being employed as a mask; removing the mask of carbon-containing film; and subjecting the insulating film and the metal film to a second etching work with the hard mask being employed as a mask.

In the manufacturing method according to the fifth aspect of the present invention, a metal film may be buried in the insulating film to be subjected to the etching work.

According to a sixth aspect of the present invention, there is provided a method of manufacturing a semiconductor device, which comprises the steps of: forming an insulating film or a metal film on a surface of a semiconductor substrate; forming a film of hard mask on a surface of the insulating film or the metal film, and patterning the film of hard mask to form a hard mask in a region where a sparse pattern is to be formed or in a region where a dense pattern is to be formed; forming a carbon-containing film on a surface of the insulating film or the metal film where the hard mask is not formed, which is followed by a patterning work of the carbon-containing film to form a mask in the region where a sparse pattern is to be formed or in the region where a dense pattern is to be formed; and subjecting the insulating film or the metal film to an etching work with the hard mask and the mask being employed as a mask.

In the manufacturing method according to the sixth aspect of the present invention, a metal film or a film of insulating material which differs from the insulating film may be buried in the insulating film to be subjected to the etching work.

According to a seventh aspect of the present invention, there is provided a method of manufacturing a semiconductor device, which comprises the steps of: forming an insulating film on a surface of a semiconductor substrate; forming a film of hard mask on a surface of the insulating film, and patterning the film of hard mask to form a hard mask in a region where wirings are to be sparsely patterned or in a region where wirings are to be densely patterned; forming a carbon-containing film on the insulating film having the hard mask formed thereon, which is followed by a patterning work of the carbon-containing film to form a mask in the region where wirings are to be sparsely patterned or in the region where wirings are to be densely patterned; subjecting the insulating film to an etching work with the hard mask and the mask being employed as a mask, thereby forming wiring grooves; removing the hard mask and the mask; forming wirings of dense pattern region or of sparse pattern region in the wiring grooves in a region where the hard mask is formed, and at the same time, forming wirings of dense pattern region or of sparse pattern region in the wiring grooves in a region where the mask is formed.

In the manufacturing method according to the seventh aspect of the present invention, in a case where the insulating film is to be worked, the hard mask may be formed of an insulating film which differs in kind from the first mentioned insulating film.

In the manufacturing method according to the seventh aspect of the present invention, the carbon-containing film may be formed of a material selected from the group consisting of a resist, a low dielectric constant insulating film, and carbon film.

In the manufacturing method according to the seventh aspect of the present invention, the process of patterning the carbon-containing film may comprise the steps of: successively forming an SOG film and a resist film on a surface of the carbon-containing film; patterning the resist film, and working the SOG film with the patterned resist film being employed as a mask; and etching the carbon-containing film with this worked SOG film being employed as a mask.

In the manufacturing method according to the seventh aspect of the present invention, wherein the process of patterning the carbon-containing film comprises the steps of: successively forming an SOG film and a resist film on a surface of the carbon-containing film; patterning the resist film, and working the SOG film with the patterned resist film being employed as a mask; and etching the carbon-containing film with this worked SOG film being employed as a mask, the patterning process may further comprise a step of forming a reflection preventive film on the SOG film.

According to an eighth aspect of the present invention, there is provided a method of manufacturing a semiconductor device, which comprises the steps of: forming a film of gate electrode on an insulating film formed on a surface of a semiconductor substrate; forming a film of hard mask on a surface of the film of gate electrode, and patterning the film of gate electrode to form a hard mask in a region where gate is designed to be sparsely formed or in a region where gate is designed to be densely formed; forming a carbon-containing film on the film of gate electrode having the hard mask formed thereon, which is followed by a patterning work of the carbon-containing film to form a mask in a region where gate is designed to be sparsely formed or in a region where gate is designed to be densely formed; subjecting the film of gate electrode to an etching work with the hard mask and the mask being employed as a mask, thereby forming a dense gate region or a sparse gate region in the film of gate electrode in a region where the hard mask is formed, and at the same time, forming a dense gate region or a sparse gate region in the film of gate electrode in a region where the mask is formed.

According to a ninth aspect of the present invention, there is provided a method of manufacturing a semiconductor device, which comprises the steps of: forming an insulating film on a surface of a semiconductor substrate; forming a film of hard mask on a surface of the insulating film, and patterning the film of hard mask to form a hard mask in a region where an element isolation region is designed to be sparsely formed or in a region where an element isolation region is designed to be densely formed; forming a carbon-containing film on the insulating film having the hard mask formed thereon, which is followed by a patterning work of the carbon-containing film to form a mask in a region where the element isolation region is designed to be sparsely formed or in a region where the element isolation region is designed to be densely formed; subjecting the insulating film to an etching work with the hard mask and the mask being employed as a mask, thereby forming grooves in the semiconductor substrate; removing the hard mask and the mask; burying the element isolation film of dense pattern region or the element isolation film of sparse pattern region in the grooves of a region where the hard mask is formed, and at the same time, burying the element isolation film of dense pattern region or the element isolation film of sparse pattern region in the grooves of a region where the mask is formed.

According to a tenth aspect of the present invention, there is provided a semiconductor device which comprises: a semiconductor substrate; a first metallic wiring layer buried in a first insulating film which has been formed on the semiconductor substrate; and a second metallic wiring layer buried in a second insulating film which has been formed on the first insulating film and electrically connected via a contact plug with the first metallic wiring layer; wherein a top surface of a prescribed wiring constituting the second metallic wiring layer is disposed higher than a top surface of another wiring constituting the second metallic wiring layers placed on both sides of the first mentioned second metallic wiring layer.

According to an eleventh aspect of the present invention, there is provided a semiconductor device which comprises: a semiconductor substrate; a first metallic wiring layer buried in a first insulating film which has been formed on the semiconductor substrate; and a second metallic wiring layer buried in a second insulating film which has been formed on the first insulating film and electrically connected via a contact plug with the first metallic wiring layer, the second metallic wiring layer being constituted by a plurality of parallel wirings; wherein top surfaces of a plurality of wirings constituting the second metallic wiring layer are disposed higher than a top surface of another wiring constituting the second metallic wiring layers placed on both sides of the first mentioned second metallic wiring layer.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Next, various embodiments of the present invention will be explained with reference to drawings.

Figure 4A:
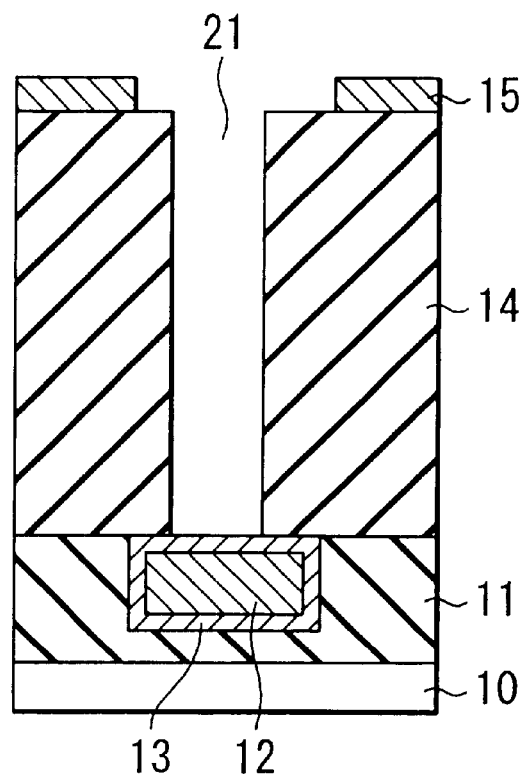
FIGS. 4A and 4B show respectively cross-sectional views illustrating the process of manufacturing the semiconductor device according to the first embodiment of the present invention.
Figure 4B:
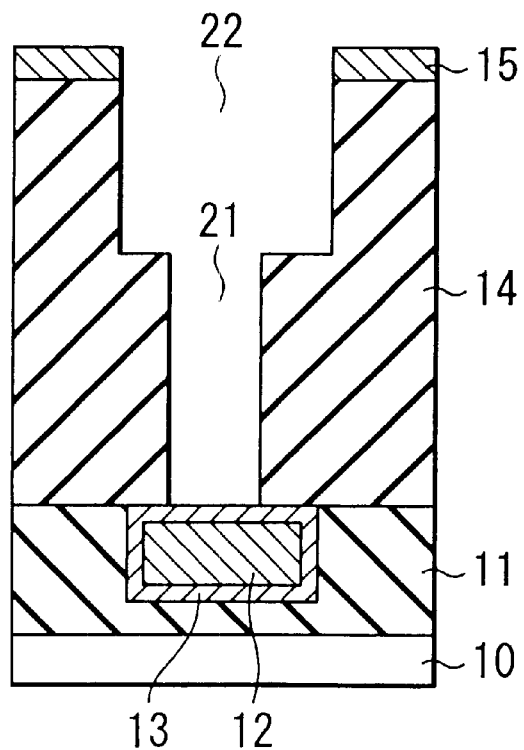
Figure 5A:
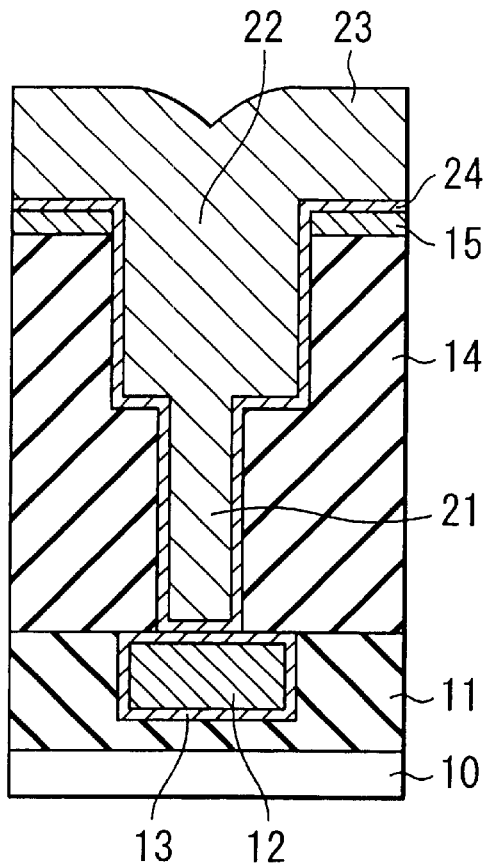
FIGS. 5A and 5B show respectively cross-sectional views illustrating the process of manufacturing the semiconductor device according to the first embodiment of the present invention.
Figure 5B:
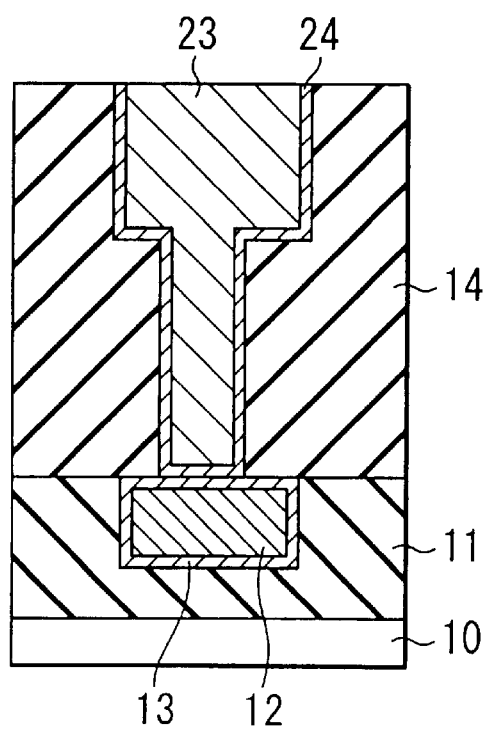
Figure 6:
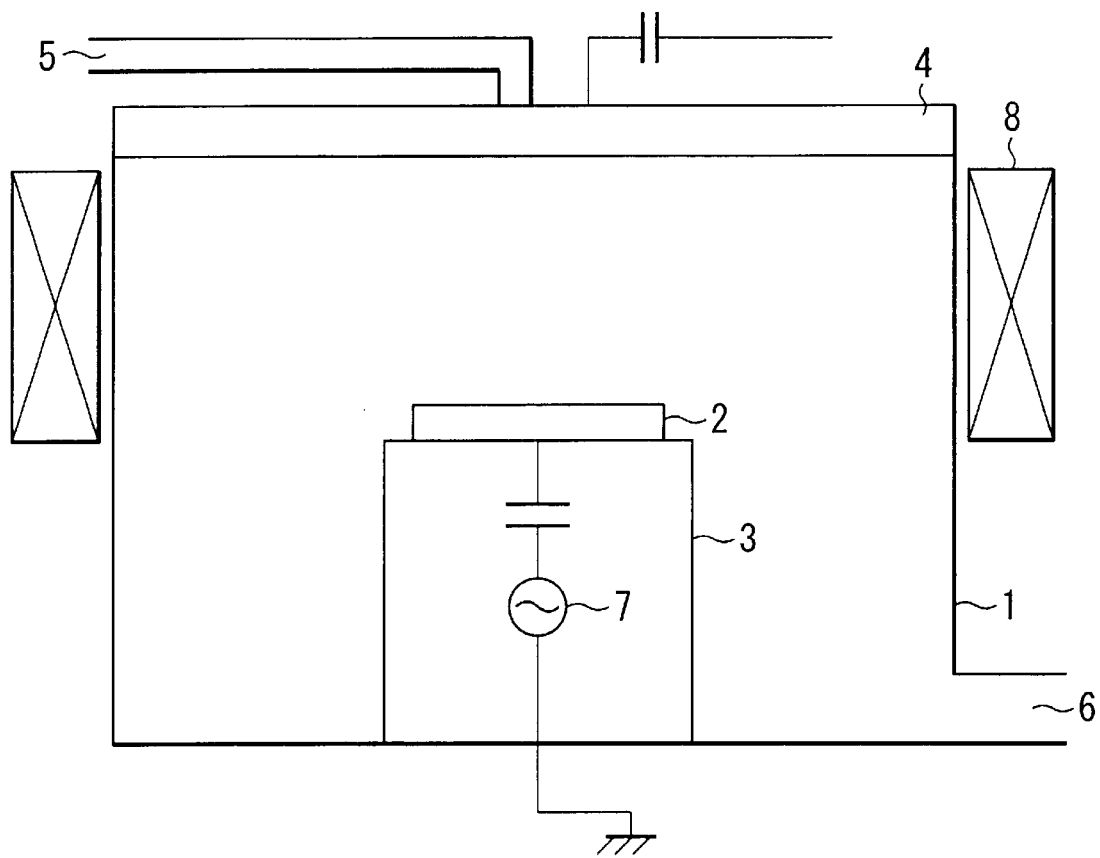
FIG. 6 is a schematic view illustrating a magnetron RIE apparatus to be employed in the embodiment of the present invention.

First of all, a first embodiment of the present invention will be explained with reference to FIGS. 1A and 1B to FIG. 6. FIGS. 1A and 1B to FIGS. 5A and 5B show respectively cross-sectional views of a semiconductor device in the process of manufacturing the semiconductor device according to a first embodiment of the present invention, which illustrate, in particular, a method of forming a dual damascene structure in an interlayer insulating film by making use of a hard mask and a resist. FIG. 6 is a schematic cross-sectional view illustrating an etching apparatus to be employed in the method of manufacturing a semiconductor device according to this embodiment.

More specifically, the etching apparatus shown in FIG. 6 is a magnetron RIE apparatus. Referring to FIG. 6, a table 3 for mounting a workpiece (or a working piece, for example, a semiconductor substrate such as a silicon semiconductor substrate in the embodiment) 2 is placed inside a vacuum chamber 1, and a counter electrode 4 is also disposed to face the table 3. The table 3 is provided with a temperature controlling mechanism so as to enable the temperature of the workpiece 2 to be controlled. Further, the vacuum chamber 1 is connected through the top wall 4 thereof with a gas inlet pipe 5, thereby enabling a gas to be introduced into the interior of the vacuum chamber 1 from the gas inlet pipe 5. The pressure inside the vacuum chamber 1 is made adjustable by means of a valve (not shown) of an exhaust port 6. When a high-frequency power is applied to the vacuum chamber 1 by means of a high-frequency electrode 7 disposed below the table 3 after the pressure inside the vacuum chamber 1 is stabilized, a plasma is caused to generate in the vacuum chamber 1. Further, a magnet 8 is attached to the outer peripheral wall of the vacuum chamber 1 for generating a high-density magnetic field in vacuum, thereby enabling the workpiece 2 to be etched anisotropically by the ions in the plasma. Although a magnetron RIE device is employed as an etching device in this embodiment, other kinds of etching device such as an ECB etching device, a helicon etching device, an inductively coupled plasma etching device, etc. can be also employed.

Next, the method of manufacturing a semiconductor device according to this embodiment will be explained with reference to FIGS. 1A and 1B to FIGS. 5A and 5B.

First, the method of manufacturing a semiconductor device according to a first embodiment of the semiconductor device of the present invention by making use of the etching device shown in FIG. 6 will be explained.

Figure 1A:
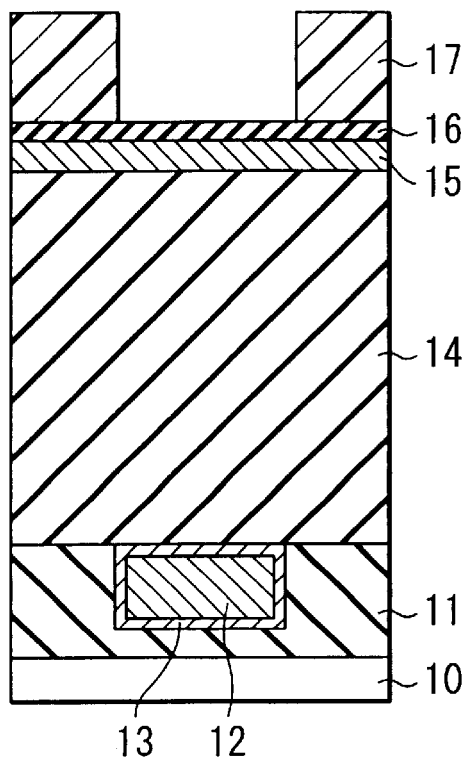
FIGS. 1A and 1B show respectively cross-sectional views illustrating the process of manufacturing a semiconductor device according to a first embodiment of the present invention, wherein especially a method of forming a contact hole and a wiring groove of a dual damascene structure in an interlayer insulating film by making use of a hard mask and a resist is explained.

An interlayer insulating film 11 such as silicon oxide film is formed on the surface of a semiconductor substrate 10 such as a silicon semiconductor substrate, and a metal wiring 12 made of aluminum for instance and covered with a barrier metal 13 made of TiN for instance is buried in the interlayer insulating film 11. Another interlayer insulating film 14 such as silicon oxide film is formed on the surface of the interlayer insulating film 11. Further, a polysilicon film 15 is formed on this interlayer insulating film 14. Additionally, a reflection preventive film 16 made of a coated layer of an organic agent for example is formed on the polysilicon film 15. Furthermore, a resist 17 is formed on the reflection preventive film 16 in such a manner that an opening corresponding to a wiring groove is formed in the resist 17 by way of patterning (FIG. 1A).

Figure 1B:
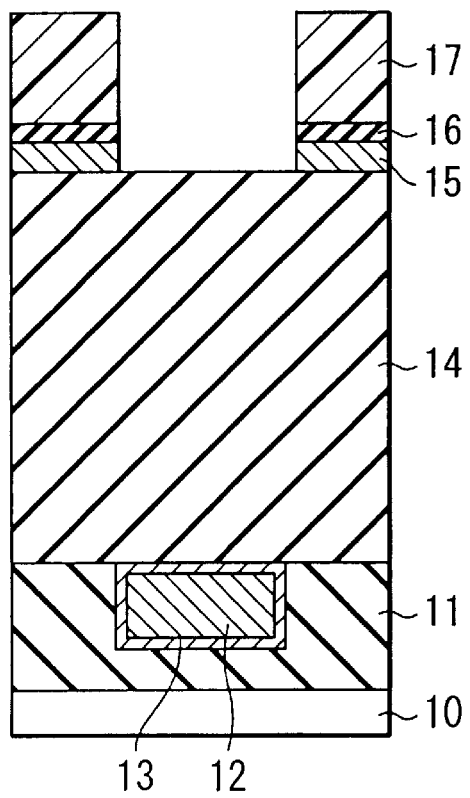

Then, by making use of the etching device shown in FIG. 6, the reflection preventive film 16 is selectively etched using the patterned resist 17 as a mask. Then, the polysilicon film 15 is selectively etched with the patterned resist 17 employed as a mask (FIG. 1B). An anisotropic etching is performed in this case under the etching conditions of: 75 mTorr, 300W and $Cl/O_2$ mixed gas=75/10 sccm. Since the etching selectivity between the interlayer insulating film 14 and the polysilicon 15 in this case is as high as about 100, the interlayer insulating film 14 acts as a stopper, thereby preventing the interlayer insulating film 14 from being excessively etched away. This is very advantageous in terms of the controllability of working depth of wiring grooves.

Then, after the resist 17 and the reflection preventive film 16 are peeled away (FIG. 2A), a resist 8 is deposited to a thickness of about 700 nm over the patterned surfaces consisting of polysilicon film 15 and the interlayer insulating film 14. Next, a SOG (Spin on Glass) film 19 is deposited to a thickness of about 100 nm on the surface of the resist 18, and then, a resist 20 is coated to a thickness of about 300 nm on the SOG film 19. In this case, the SOG film 19 is formed by dissolving silanol $(Si(OH)_4)$ in alcohol to obtain a solution which is coated on the substrate while rotating the substrate, the resultant coated layer being subsequently baked at a temperature of about 200 to 300° C. to obtain the SOG film 19.

Figure 2A:
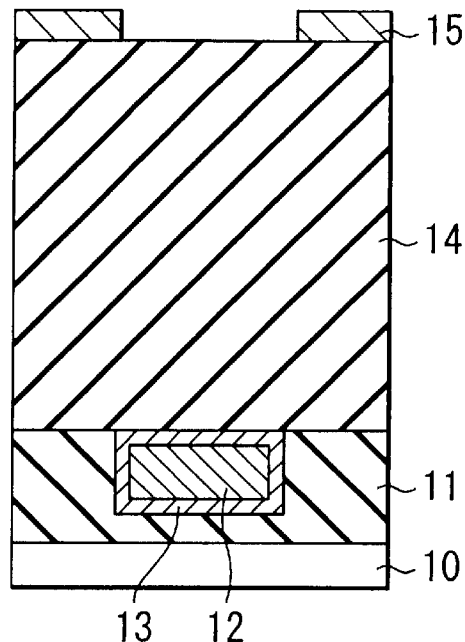
FIGS. 2A and 2B show respectively cross-sectional views illustrating the process of manufacturing the semiconductor device according to the first embodiment of the present invention.
Figure 2B:
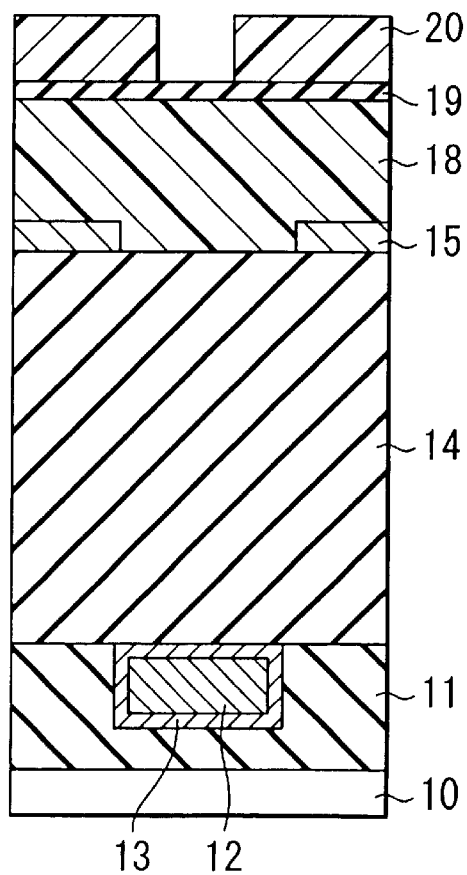
Figure 3A:
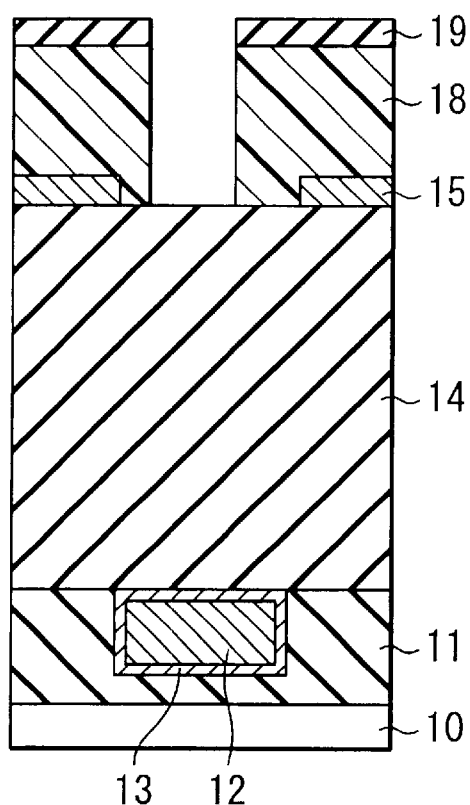
FIGS. 3A and 3B show respectively cross-sectional views illustrating the process of manufacturing the semiconductor device according to the first embodiment of the present invention.

Thereafter, the resist 20 is subjected to a patterning process using the resist 18 as a reflection preventive film to thereby form an opening corresponding to a contact hole (FIG. 2B). Alternatively, this opening may be formed by a process wherein a reflection preventive film is coated on the surface of the SOG film 19, and then, the resist 20 is coated thereon to form a resist layer which is then subjected to a patterning process using this reflection preventive film as a reflection preventive layer to thereby form an opening corresponding to a contact hole. After the opening corresponding to a contact hole is formed by performing the patterning of the resist 20 by making use of the resist 18 as a reflection preventive film, the SOG film 19 and the underlying resist 18 are selectively etched using the patterned resist 20 as a mask to thereby form an opening corresponding to the contact hole. The anisotropic etching (RIE) of the SOG film 19 is performed in this case under the etching conditions of: 20 mTorr, 1000W and $CF_4/O_2$ mixed gas=60/10 sccm. The anisotropic etching of the underlying resist 18 is performed under the conditions of: 40 mTorr, 400W and $N_2/O_2$ mixed gas=100/20 sccm, thereby making it possible to secure an etching selectivity of 100 or more relative to the SOG film 19. Additionally, a selectivity of 100 or more can be secured between the underlying resist 18 and the interlayer insulating film 14 (FIG. 3A). Although the underlying resist 18 is employed as a resist in the above embodiment, almost the same effect as obtainable in the above embodiment can be obtained by making use of a sputtered or coated carbon film, or a low permittivity insulating film (hereinafter referred to as Low-k film) containing no silicon such as flare, silk, etc.

Figure 3B:
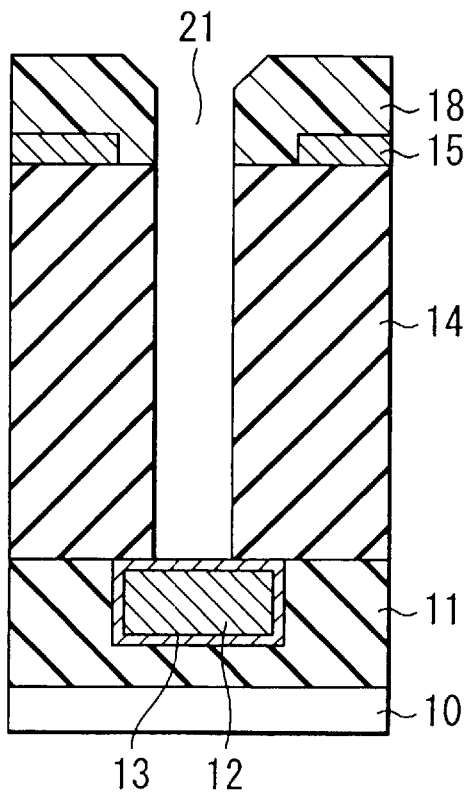

Then, after the creation of these masks 15 and 18, a contact hole 21 is formed in the interlayer insulating film 14. The etching conditions in this case are: 20 mTorr, 1400W and $C_4F_8/CO/O_2/Ar$ mixed gas=10/50/5/100 sccm. The selectivity between the resist 18 and the interlayer insulating film 14 under these etching conditions is about 15, while the selectivity between the resist 18 and the polysilicon film under these etching conditions is about 40. The thickness of the interlayer insulating film 14 may be about J+70% when the etching work of 1000 nm or so is to be performed (FIG. 3B). After the etching work of the contact hole 21 is finished, the resist 18 is peeled away by means of an $O_2$ RIE. Although the peeling of the resist 18 is performed by means of an $O_2$ RIE in this embodiment, it is also possible to employ a down-flow asher (FIG. 4A). After the removal of the resist 18, a wiring groove 22 having a depth of about 400 nm is formed using the patterned polysilicon film 15 which has been disposed below the resist 18.

The etching conditions in this case may be the same as those of the contact hole, i.e. 20 mTorr, 1400W and $C_4F_8/CO/O_2/Ar$ mixed gas=10/50/5/100 sccm. It is possible under these conditions to secure a selectivity of about 40 relative to the polysilicon film. As a result, a dual damascene working (groove/hole concurrent working) can be performed with excellent controllability, thereby forming the wiring groove 22 (FIG. 4B). Thereafter, a barrier metal such as TiN is deposited over the surface of the wiring groove 22, and then, Al is deposited thereon to form an Al film (FIG. 5A), which is subsequently flattened by means of a CMP to form a metal wiring (aluminum wiring) 23 in the wiring groove and in the contact hole, the metal wiring 23 being covered with the barrier metal 24 such as TiN and formed integral with a contact plug (FIG. 5B). With regard to the material for this wiring, it is also possible to create this wiring by a process wherein an Nb liner is deposited at first, and then, a conductive material such as Al, Al—Si—Cu, Al—Cu, Cu or Ag is deposited thereon to form the wiring.

Although a polysilicon film is employed as a hard mask in this embodiment, it is also possible in the present invention to employ an insulating film such as a silicon oxynitride film, a SiC film, an $Al_2O_3$ film, a $WO_3$ film, a $TiO_x$ film and a SiN film; or a metal film such as a W film, a WSi film, a Ti film, a TiN film, a Nb film, an Al film, an Al—Si—Cu film and an Al—Cu film. Further, although a silicon oxide film is employed as an interlayer insulating film in this embodiment, it is also possible in the present invention to employ an organic silicon oxide film or an inorganic silicon oxide film. Additionally, although the hard mask is formed through the working of the wiring in this embodiment, the hard mask can be formed by working a contact hole pattern or other kinds of pattern. Moreover, although the working of an insulating film is exemplified in this embodiment, a metal film can be worked in the same manner as mentioned above. In this case, the hard mask can be created by making use of an insulating film such as SiON film, a SiC film, an $Al_2O_3$ film, a $WO_3$ film, a $TiO_x$ film and a SiN film; or a metal film such as a TiN film.

According to this embodiment, the work to form a resist mask is performed after the working of a hard mask, thereby enabling the hard mask to be totally incorporated within the resist film. As a result, it becomes possible to create various worked shapes within a semiconductor chip with excellent controllability.

Next, a second embodiment of the present invention will be explained with reference to FIGS. 7A and 7B to FIGS. 9A and 9B.

FIGS. 7A and 7B to FIGS. 9A and 9B show respectively cross-sectional views illustrating the process of manufacturing a semiconductor device, wherein a wiring having an interlayer insulating film (silicon oxide film) of dual damascene structure which is interposed between wirings, and a contact plug which is disposed in a contact hole are created by making use of a hard mask and a resist.

In this embodiment, a polysilicon film is employed as a hard mask to be formed in the interlayer insulating film. Further, a method of forming a contact between different layers of wiring in a multilayer wiring as well as a method of applying various workings to an interlayer insulating film so as to form only the contact or to concurrently form both of the contact and the wiring are explained in this embodiment.

Referring to these FIGS. 7A and 7B to FIGS. 9A and 9B, an interlayer insulating film 31 made of a silicon oxide film is formed on the surface of a semiconductor substrate 30 such as a silicon semiconductor substrate, and a first metal wiring 32 (a first layer) made of aluminum for instance and covered with a barrier metal 33 made of TiN for instance is buried in the interlayer insulating film 31. Another interlayer insulating film 34 such as silicon oxide film is formed on the surface of the interlayer insulating film 31. Further, a second metal wiring 32' (a second layer) made of aluminum for instance and covered with a barrier metal 33' made of TiN for instance is buried in this interlayer insulating film 34. Additionally, a polysilicon film 35 is formed on the interlayer insulating film 34.

In this embodiment, the contact to be connected with the first metal wiring is formed in the region A, while the contact to be connected with the second metal wiring and an upper wiring layer are formed in the region B.

In both of these regions A and B, the polysilicon film 35 is employed as a hard mask for the interlayer insulating film 34. Namely, a resist (not shown) is formed on the polysilicon film 35 so as to use the resist as a mask. This resist is patterned into the shape of contact hole in the region A, and into the shape of wiring groove in the region B, the resultant masks thus patterned are subsequently employed in etching the polysilicon film 35.

The conditions for etching the polysilicon film 35 using these resist masks are: 75 mTorr, 300W and $Cl/O_2$ mixed gas=75/10 sccm, under which an anisotropic etching (RIE) is performed. Since the etching selectivity between the interlayer insulating film 34 and the polysilicon 35 in this case is as high as about 100, the interlayer insulating film 34 acts as a stopper, thereby preventing the interlayer insulating film 34 from being excessively etched away. This is very advantageous in terms of the controllability of working depth of wiring grooves.

Then, after the resist is peeled away, a resist 36 is deposited to a thickness of about 700 nm over the patterned surfaces. Next, a SOG film 37 is coated to a thickness of about 100 nm on the surface of the resist 36, and then, a resist (not shown) is coated to a thickness of about 300 nm on the SOG film 19. Thereafter, this resist (not shown) is subjected to a patterning process using the resist 36 as a reflection preventive film to thereby perform the patterning of the contact hole. In this case, this patterning may be performed by a process wherein a reflection preventive film is coated on the surface of the SOG film, and then, the resist is coated thereon and patterned.

Figure 7A:
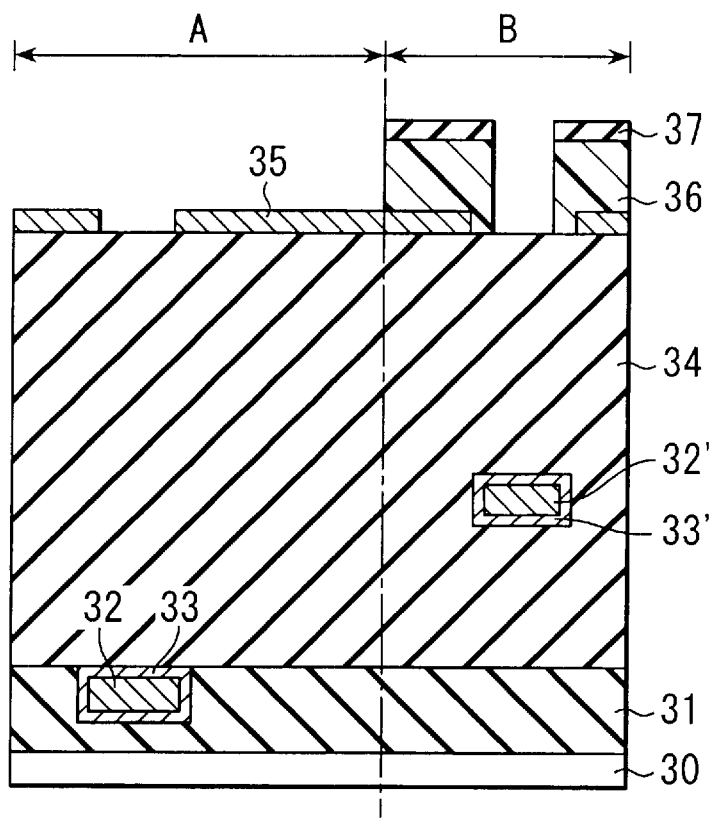
FIGS. 7A and 7B show respectively cross-sectional views illustrating the process of manufacturing a semiconductor device according to a second embodiment of the present invention, wherein a wiring having an interlayer insulating film (silicon oxide film) of dual damascene structure which is interposed between wirings, and a contact plug which is disposed in a contact hole are created by making use of a hard mask and a resist.

On this occasion, an upper resist layer is employed as a mask for working the SOG film, and the mask of the SOG film is employed for working a lower resist layer 36. The conditions for etching the SOG film 37 in this case are: 20 mTorr, 1000W and $C_4F/O_2$ mixed gas=60/10 sccm, under which an anisotropic etching is performed. On the other hand, the conditions for etching the lower resist layer 36 are: 40 mTorr, 500W and $N_2/O_2$ mixed gas=150/10 sccm, under which an anisotropic etching is performed. It is possible under this working condition of the lower resist layer 36 to secure a selectivity of 100 or more relative to the SOG film, and also to secure a selectivity of 100 or more relative to the interlayer insulating film 34. In this case, with respect to the region where only the plug of contact is to be formed (region A), the lower resist film 36 existing therein is removed, leaving only the hard mask of the polysilicon film 35 (FIG. 7A). Although a resist is employed for the portion identified by the reference number 36 in this embodiment, almost the same effect as obtainable in the above embodiment can be obtained by making use of a sputtered or coated carbon film, or the Low-k film containing no silicon such as flare, silk, etc.

Figure 7B:
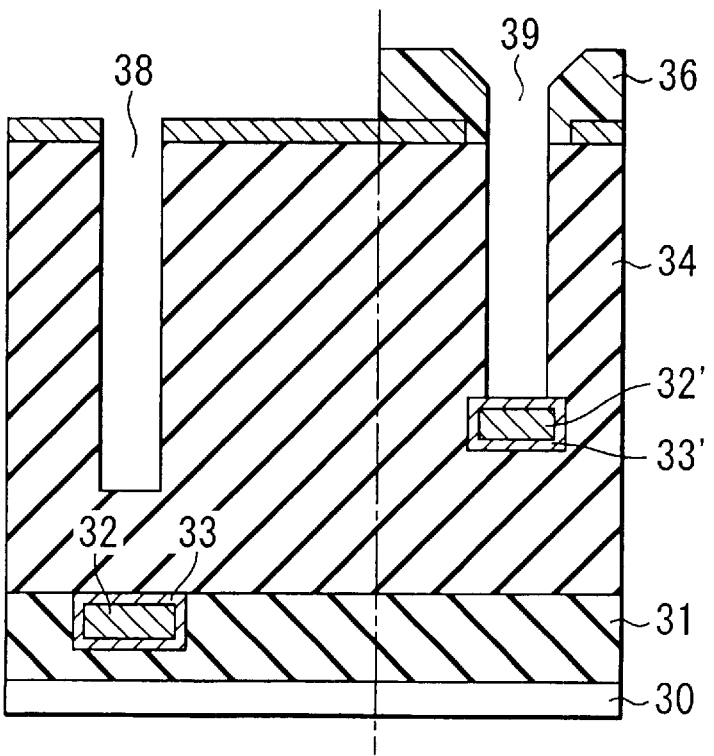
Figure 8A:
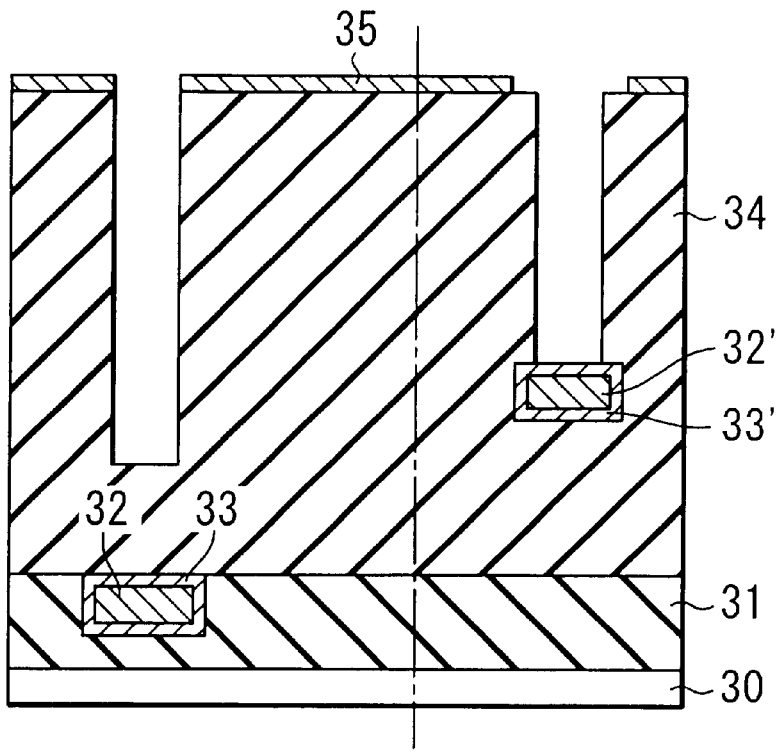
FIGS. 8A and 8B show respectively cross-sectional views illustrating the process of manufacturing the semiconductor device according to the second embodiment of the present invention.

Then, after the creation of these masks, a process for forming a contact hole is performed. The etching conditions in this case are: 20 mTorr, 1400W and $C_4F_8/CO/O_2/Ar$ mixed gas=10/50/5/100 sccm. Namely, under these working conditions, the contact holes 38 and 39 are formed. The selectivity between the resist 36 and the interlayer insulating film 34 under these etching conditions is about 15, while the selectivity between the resist 36 and the polysilicon film under these etching conditions is about 40. When the etching work of 1000 nm or so is performed for the interlayer insulating film 14, it is preferable that the thickness of the interlayer insulating film 14 has about 1700 nm i.e. about 170% of the etching amount of 1000 or so. At this moment, the portion of the contact hole which is formed using the mask of the polysilicon film 35 will be etched away by a depth of about 1700 nm (FIG. 7B). Then, the resist 36 is peeled away by means of an $O_2$ RIE (FIG. 8A). Although the peeling of the resist 36 is performed by means of an $O_2$ RIE in this embodiment, it is also possible to employ a downflow asher. Then, a wiring groove 40 having a depth of about 500 nm is formed using the mask of the polysilicon film 35 which has been formed into a wiring groove shape and disposed at a lower portion of the resist 36.

The etching conditions in this case may be the same as those of the contact hole, i.e. 20 mTorr, 1400W and $C_4F_8$/$CO$/$O_2$/Ar mixed gas=10/50/5/100 sccm. As a result, a dual damascene working (groove/hole concurrent working) can be performed with excellent controllability. Additionally, the contact hole portion of the mask of the polysilicon film 35 can be further etched to a depth of 500 nm or more under these conditions (under these conditions, the portion of the contact hole which is narrower in opening can be etched at an etching rate which is 1.3 times larger as compared with the other portions).

Figure 8B:
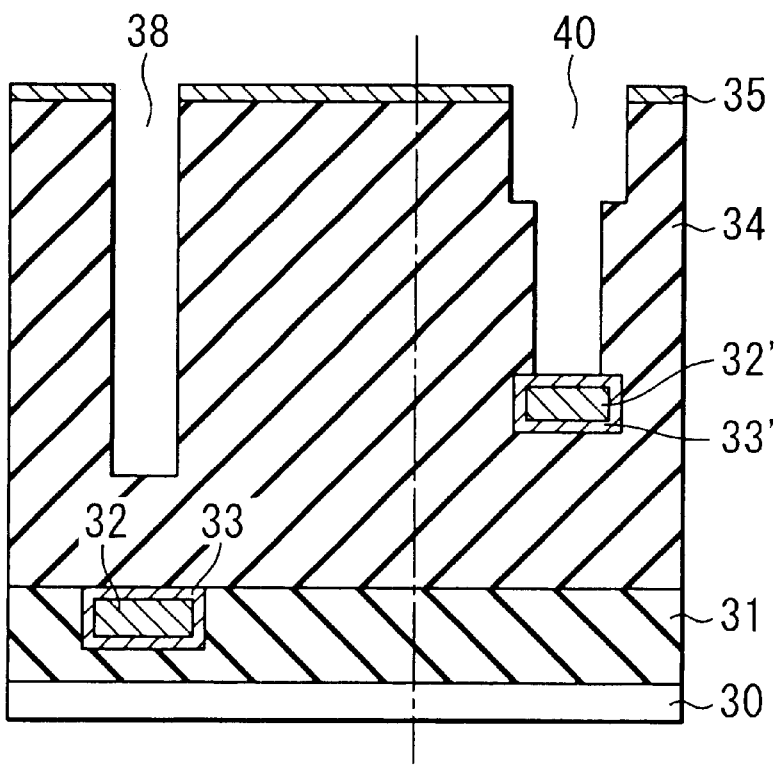
Figure 9A:
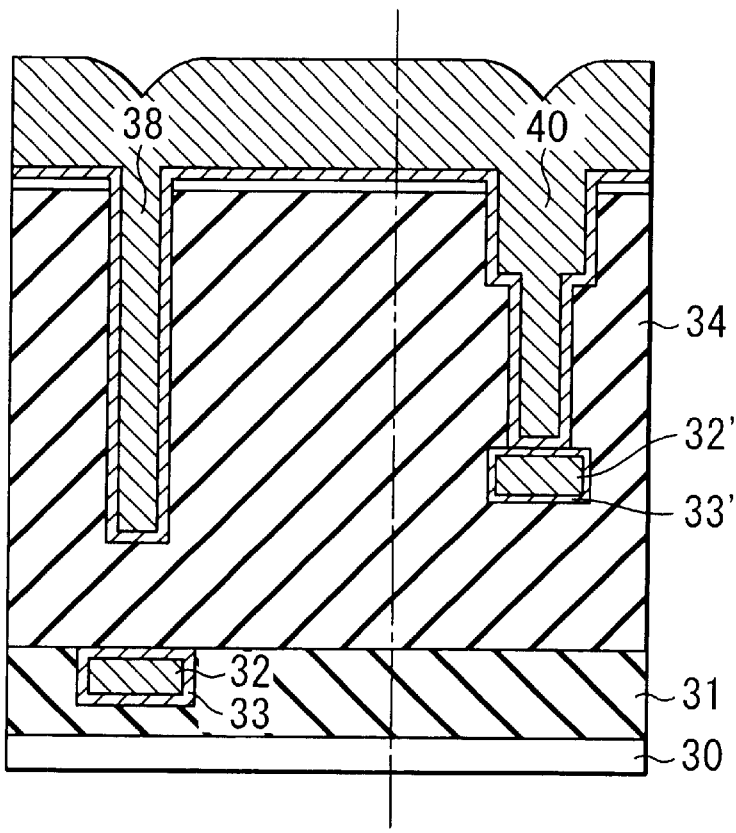
FIGS. 9A and 9B show respectively cross-sectional views illustrating the process of manufacturing the semiconductor device according to the second embodiment of the present invention.
Figure 9B:
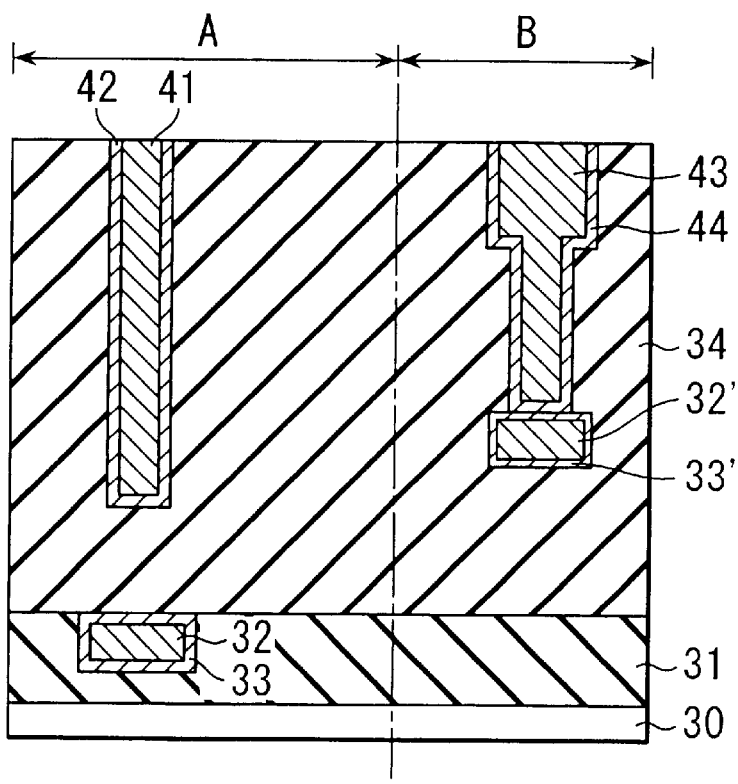

Therefore, the contact hole 38 formed in the polysilicon film 35 can be worked to a depth of about 2200 nm or more, so that the contact hole 38 can be sufficiently worked through an interlayer insulating film of 2000 nm in thickness. As a result, a dual damascene work as well as the working of contact hole 38 of high aspect ratio can be performed in the interlayer insulating film 34 (FIG. 8B). In this case, since the selectivity of the TiN barrier metal is 40 or more under these conditions for working the interlayer insulating film, no problem would be raised. Next, an Nb liner is subsequently deposited, a wiring material such as Al, Al—Si—Cu, Al—Cu, Cu or Ag is deposited thereon to form a film (FIG. 9A). The resultant film is flattened by means of a CMP, thereby forming a structure, in the region A of which a contact plug 41 covered with a barrier metal 42 is buried in the contact hole, while in the region B of which a metal wiring 43 made of aluminum which is provided with a contact plug and covered with a barrier metal 44 is buried in the wiring groove provided with a contact hole (FIG. 9B).

Although a polysilicon film is employed as a hard mask in this embodiment, it is also possible in the present invention to employ an insulating film such as a SiN film, a SiON film, a SiC film, an $Al_2O_3$ film, a $WO_3$ film and a $TiO_x$ film; or a metal film such as a W film, a WSi film, a Ti film, a TiN film, a Nb film, an Al film, etc. Further, although a silicon oxide film is employed as an interlayer insulating film in this embodiment, it is also possible in the present invention to employ an organic silicon oxide film or an inorganic silicon oxide film and work them in the same manner as explained above. Additionally, although the hard mask is worked for forming a contact hole in this embodiment, the hard mask can be worked in the same manner for forming a wiring pattern or other patterns.

According to this embodiment, the work to form a resist mask is performed after the working of a hard mask, thereby enabling the hard mask to be totally incorporated within the resist film, or thereby forming a region where the resist mask is disposed and another region where the hard mask is disposed. As a result, it becomes possible to provide a single interlayer insulating film having a single type of worked shape or having a plural types of worked shape, each of various worked shapes within a semiconductor chip being formed with excellent controllability. In this case, part of the interlayer insulating film is worked to form a contact hole, and another part of interlayer insulating film is worked to form a dual damascene structure. However, it is also possible to partially form other kinds of worked shape.

Next, a third embodiment of the present invention will be explained with reference to FIGS. 10A and 10B to FIG. 17.

Figure 15A:
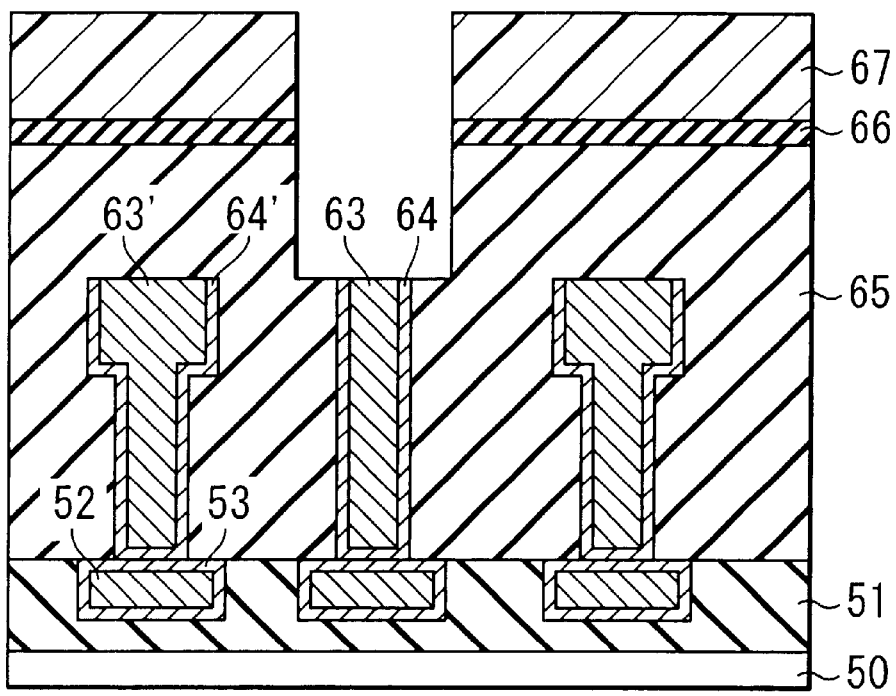
FIGS. 15A and 15B are cross-sectional views illustrating the manufacturing process of the semiconductor device according to the third embodiment of the present invention.
Figure 15B:
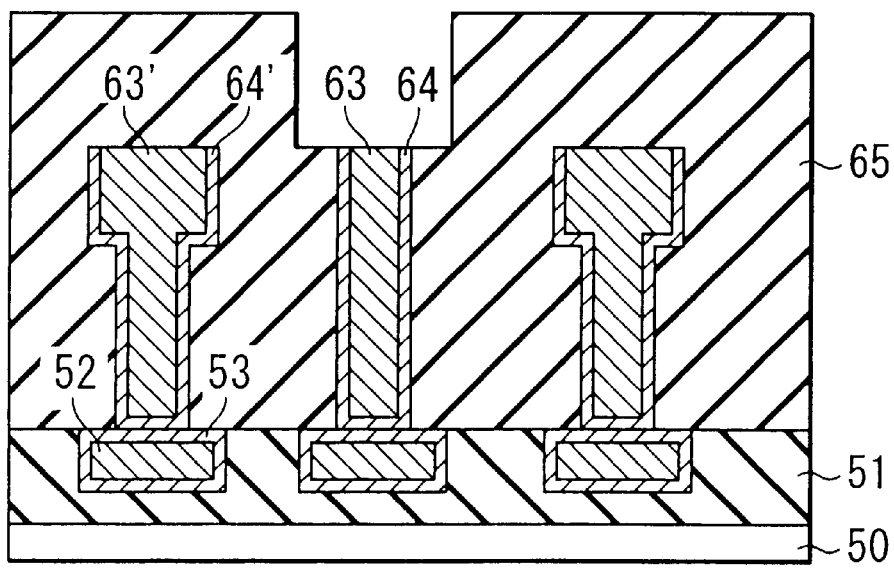
Figure 16:
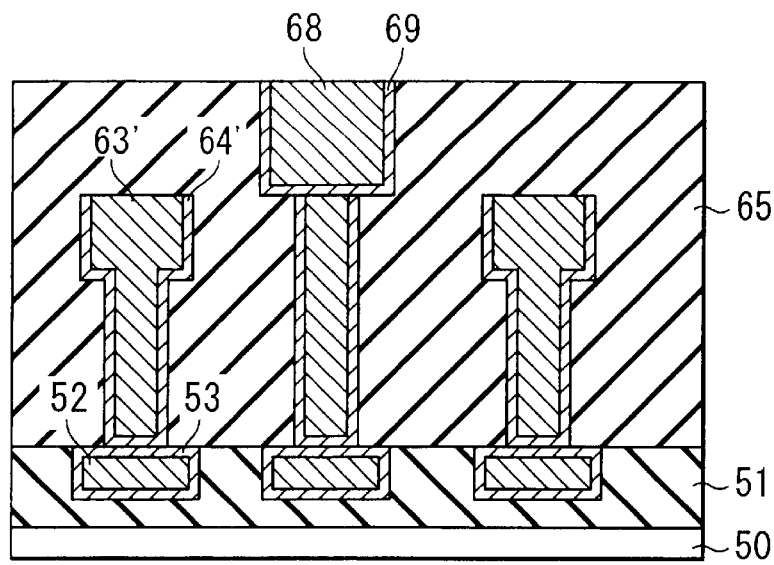
FIG. 16 is a cross-sectional view illustrating the manufacturing process of the semiconductor device according to the third embodiment of the present invention.
Figure 17:
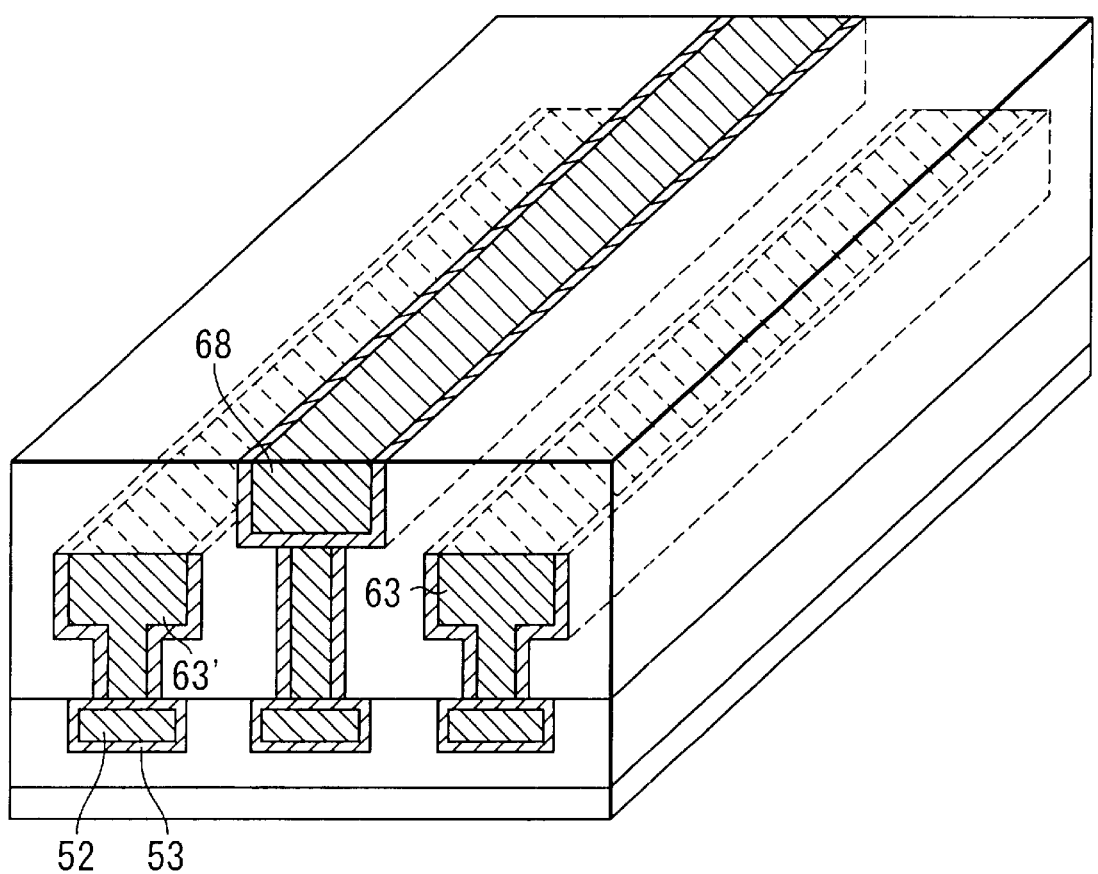
FIG. 17 is a perspective view of the semiconductor device shown in FIG. 16.

In this embodiment, the structure and manufacturing method of a semiconductor device having a high-density wiring structure are explained. FIGS. 10A and 10B to FIG. 16 are cross-sectional views illustrating the manufacturing process of a semiconductor device. FIG. 17 is a perspective view of this semiconductor device.

At present, a multi-layer wiring structure is extensively employed in a semiconductor device. In this multi-layer wiring structure, all of the wirings existing in a certain wiring layer are arranged on the same plane. Therefore, if a plurality or wirings each connected with a contact plug are arrayed, the region of the contact plug whose diameter is smaller than the width of wiring becomes sparse in density as compared with the region of the wiring even if the wiring regions are densely arranged. Accordingly, this embodiment is featured in that where a plurality of wirings are arrayed, a wiring interposed between neighboring couple of wirings is disposed at a higher level than this couple of wirings by the height corresponding to at least the thickness of one wiring layer. When these wirings are arranged in this manner, the intermediate wiring interposed between the neighboring couple of wirings is positioned such that the contact plug thereof which is relatively small in diameter is caused to face these neighboring couple of wirings, so that these wirings can be positioned closer to each other than the case where only the wirings are caused to directly face to each other.

Figure 10A:
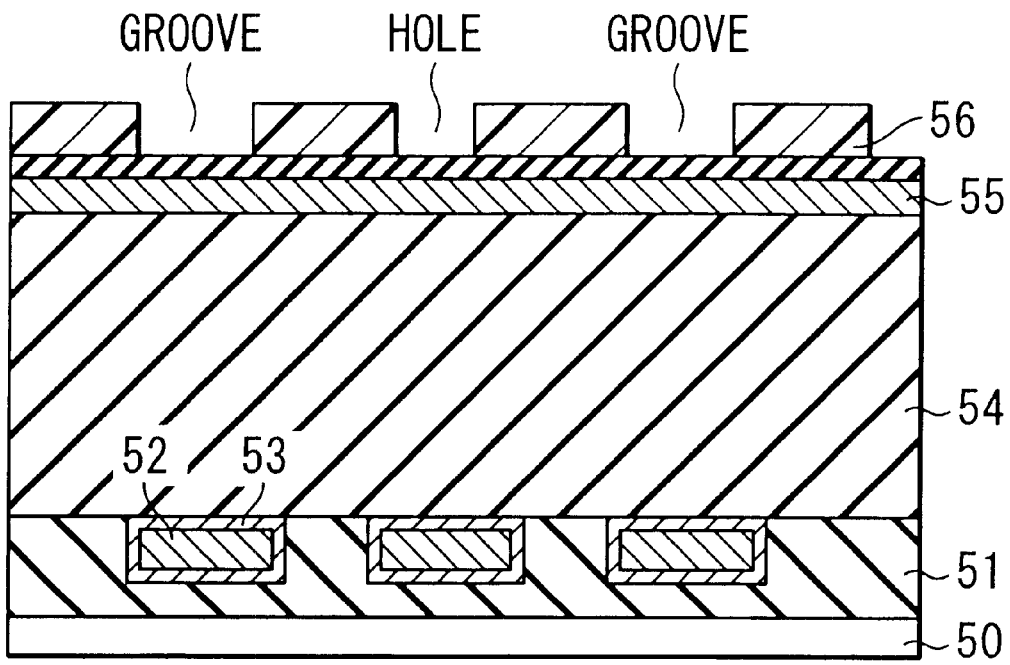
FIGS. 10A and 10B are cross-sectional views illustrating the manufacturing process of a semiconductor device according to a third embodiment of the present invention.

Referring to these FIGS. 10A and 10B to FIG. 16, an interlayer insulating film 51 made of a silicon oxide film for instance is formed on the surface of a semiconductor substrate 50 such as a silicon semiconductor substrate, and a first metal wiring 52 (a first layer) made of aluminum for instance and covered with a barrier metal 53 made of TiN for instance is buried in the interlayer insulating film 51. Another interlayer insulating film 54 such as silicon oxide film is formed on the surface of the interlayer insulating film 51. Additionally, a polysilicon film 55 is formed on the interlayer insulating film 54 (FIG. 10A).

Figure 10B:
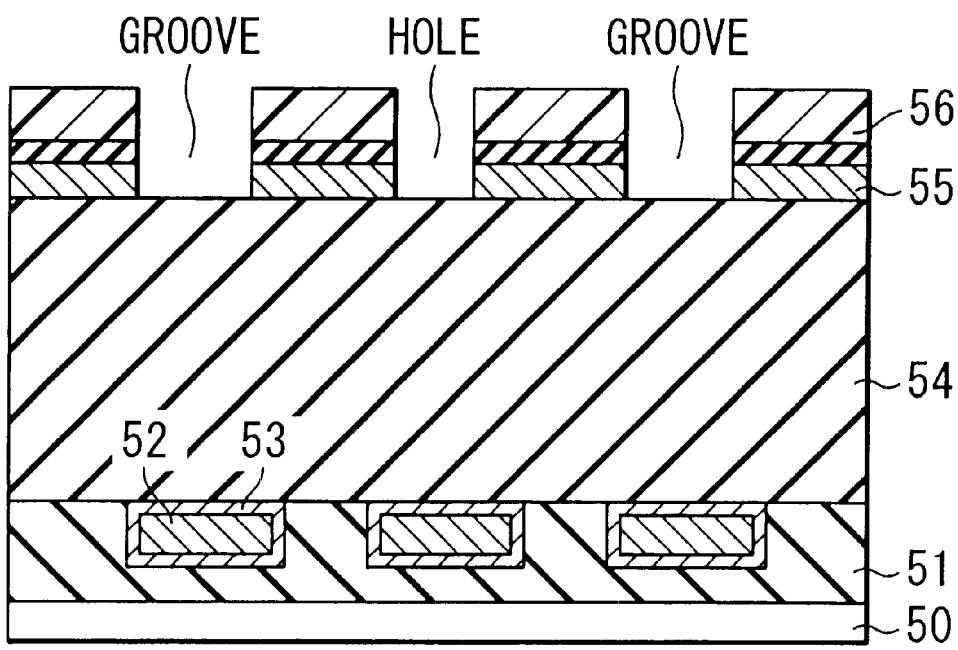

First of all, a polysilicon film 55 is employed as a hard mask for the interlayer insulating film (silicon oxide film). A reflection preventive film is formed on the polysilicon film 55, and then, a resist 56 is patterned to form a mask, which is then employed for performing an etching (FIG. 10B). In this case, the pattern is created so as to alternately form the groove and the hole.

The conditions for etching the reflection preventive film are: 20 mTorr, 1000W and $CF_4$/$O_2$ mixed gas=60/100 sccm, and the conditions for etching the polysilicon film 55 are: 75 mTorr, 300W and Cl/$O_2$ mixed gas=75/10 sccm, under which an anisotropic etching is performed. Since the etching selectivity between the interlayer insulating film 54 and the polysilicon 55 in this case is as high as about 100, the interlayer insulating film 54 acts as a stopper, thereby preventing the interlayer insulating film 54 from being excessively etched away.

Figure 11A:
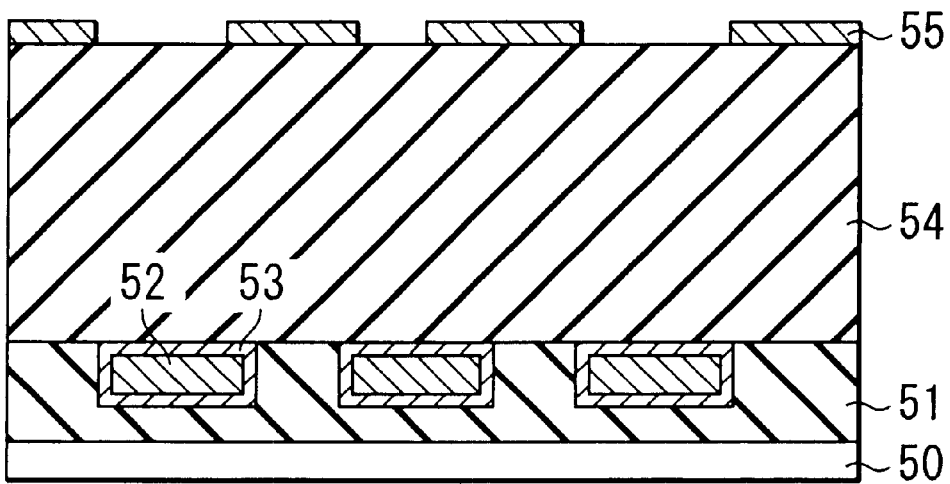
FIGS. 11A and 11B are cross-sectional views illustrating the manufacturing process of the semiconductor device according to the third embodiment of the present invention.
Figure 11B:
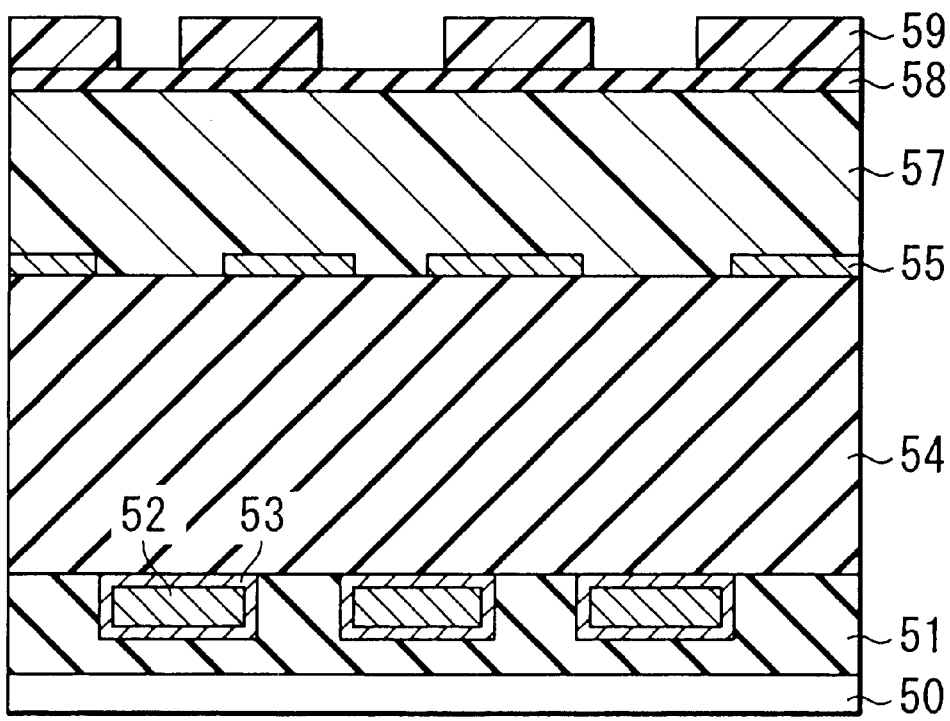

Then, after the resist 56 and the reflection preventive film are peeled away (FIG. 11A), a resist 57 is deposited to a thickness of about 700 nm over the patterned surfaces consisting of polysilicon film 55 and the interlayer insulating film 54. Next, a SOG film 58 is deposited to a thickness of about 100 nm on the surface of the resist 57, and then, a resist 59 is coated to a thickness of about 300 nm on the SOG film 58 (FIG. 11B). Thereafter, by making of the SOG film 58 as a reflection preventive film, the patterning of contact hole is performed at the region of the hard mask where wiring groove is to be formed, and at the same time, the patterning of groove is performed so as to expose the hole at the region of the hard mask where the hole is to be formed. On this occasion, the upper resist layer 59 is employed as a mask for working the SOG film 58, and then, the mask of the SOG film 58 is employed for working the lower resist layer 57. The conditions for etching the SOG film 58 in this case are: 20 mTorr, 1000W and $CF_4$/$O_2$ mixed gas=60/10 sccm, under the conditions of which anisotropic etching is performed. On the other hand, the conditions for etching the lower resist layer 57 in this case are: 40 mTorr, 500W and $N_2/O_2$ mixed gas=150/10 sccm, under the conditions of which anisotropic etching is performed. These etching conditions for the lower resist layer 57 enable to secure an etching selectivity of 100 or more relative to the SOG film. On this occasion, a resist pattern is formed at a region where the wiring groove is to be formed, and a mask is formed only at the region of the contact hole by making use of only the hard mask.

Figure 12A:
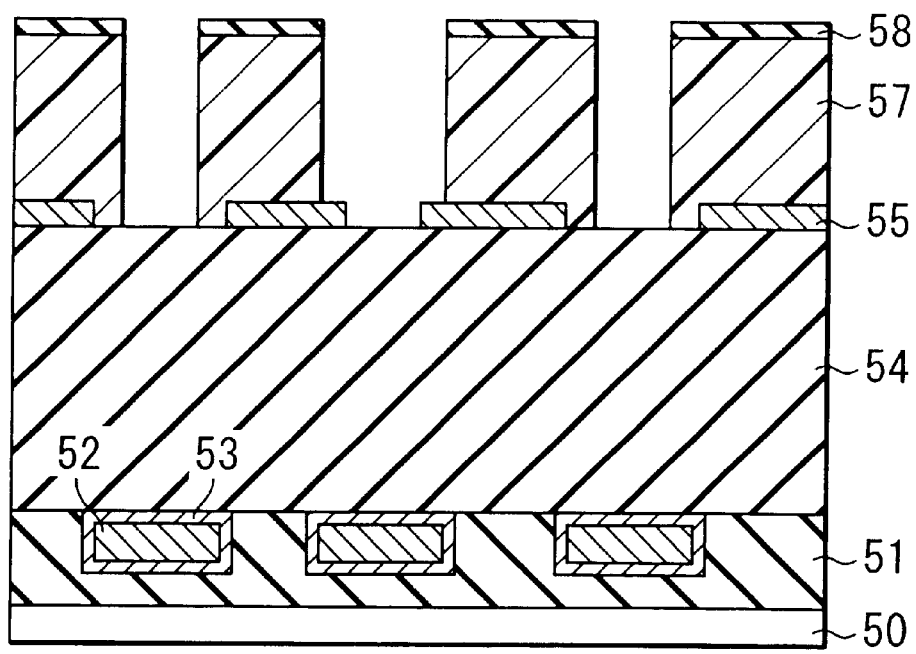
FIGS. 12A and 12B are cross-sectional views illustrating the manufacturing process of the semiconductor device according to the third embodiment of the present invention.
Figure 12B:
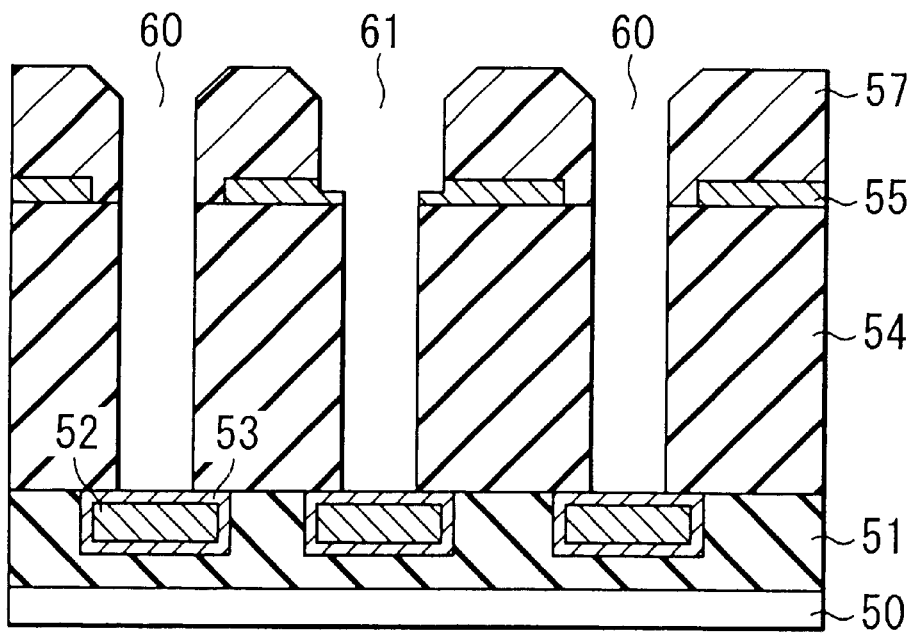

Although a resist is employed for the portion identified by the number 57 in this embodiment, almost the same effect as obtainable in the above embodiment can be obtained by making use of a sputtered or coated carbon film, or the Low-k film containing no silicon such as flare, silk, etc. The creation of this pattern is performed alternately (FIG. 12A).

Figure 13A:
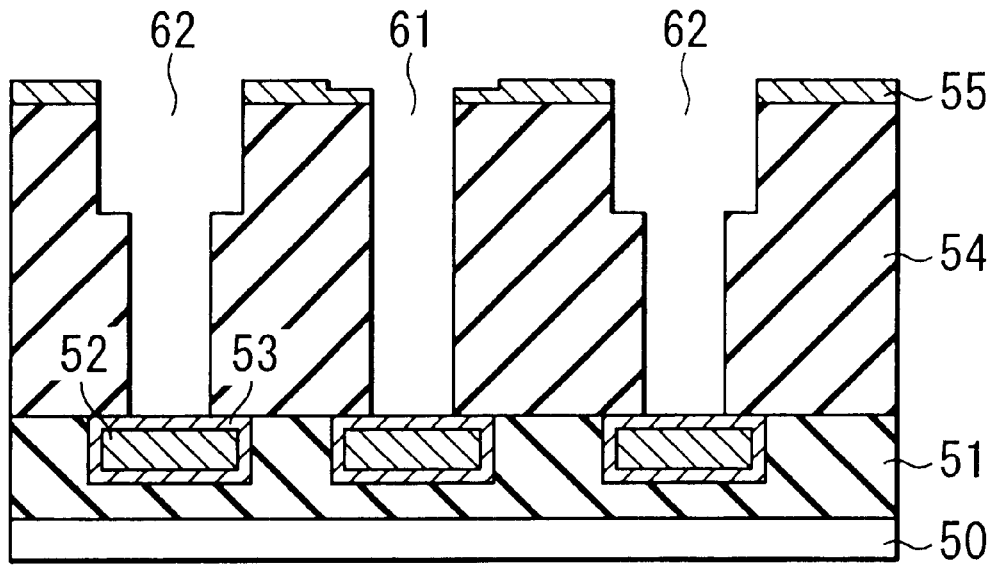
FIGS. 13A and 13B are cross-sectional views illustrating the manufacturing process of the semiconductor device according to the third embodiment of the present invention.

Then, a process for forming contact holes 60 and 61 is performed. The etching conditions in this case are: 20 mTorr, 1400W and $C_4F_8/CO/O_2/Ar$ mixed gas=10/50/5/100 sccm. The selectivity between the resist and the interlayer insulating film under these etching conditions is about 15, while the selectivity between the resist and the polysilicon film under these etching conditions is about 40. After the working of the contact holes (FIG. 12B), the resist 57 is peeled away by means of an $O_2$ RIE. Thereafter, an etching work is performed for the interlayer insulating film 54 using the polysilicon film 55 as a hard mask to provide the wiring groove 62 and also the contact hole 61 (FIG. 13A). The etching conditions on this occasion may be the same as those employed for working the contact hole. As a result, an alternate dual damascene work pattern of wiring grooves 62 and the contact holes 61 can be formed. After an Nb liner is subsequently deposited, a wiring material such as Al—Cu is buried and then, flattened by means of CMP. The hard mask employed in this case is removed by means of CMP.

Figure 13B:
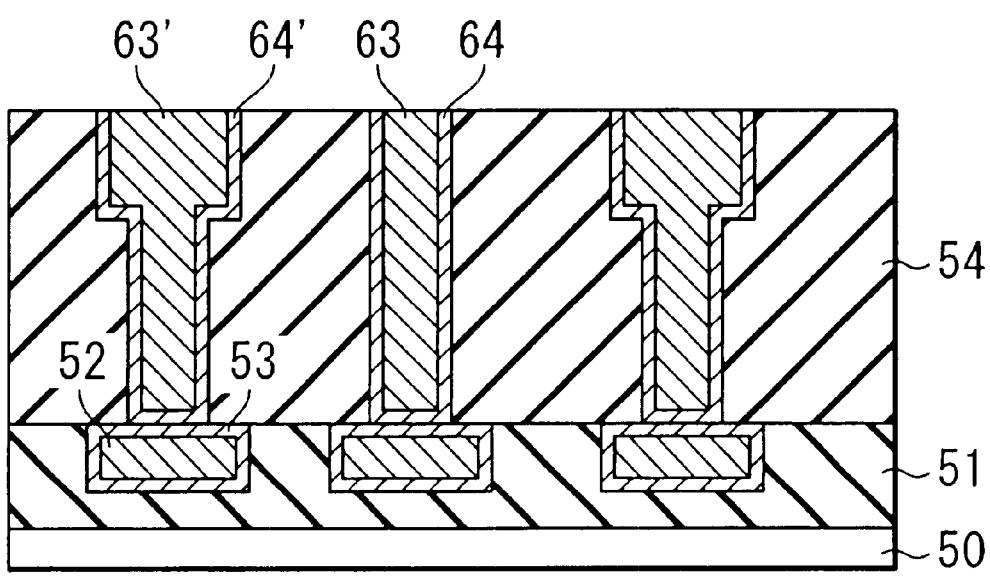

Then, a contact plug 63 made of a metal such as aluminum and covered with a barrier metal 64 is buried in the contact hole, and a metal wiring 64' having a contact plug and covered with a barrier metal 64' is buried in the wiring groove having a contact hole. After finishing these burying procedures, the flattening of the resultant surface is performed by means of CMP. Although an Al—Cu alloy is employed as a wiring material in this embodiment, other kinds of conductive material such as Al, Al—Si—Cu, Cu or Ag can be employed as a wiring material (FIG. 13B).

Figure 14A:
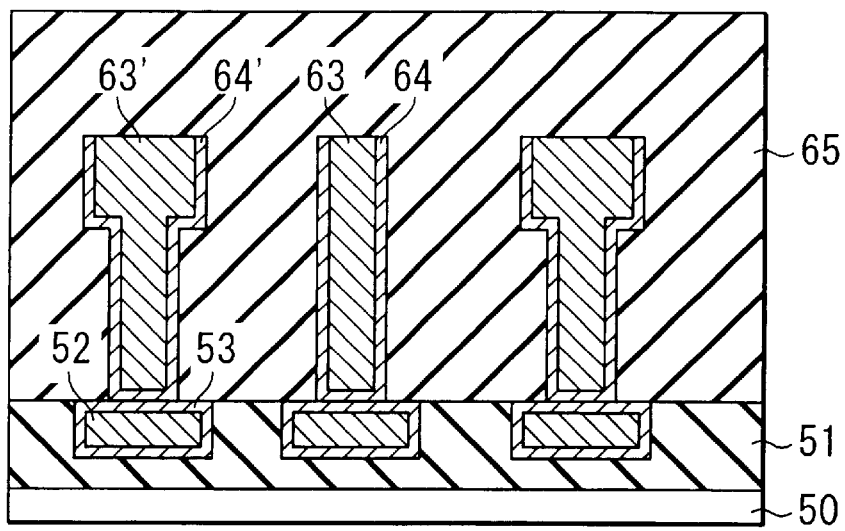
FIGS. 14A and 14B are cross-sectional views illustrating the manufacturing process of the semiconductor device according to the third embodiment of the present invention.
Figure 14B:
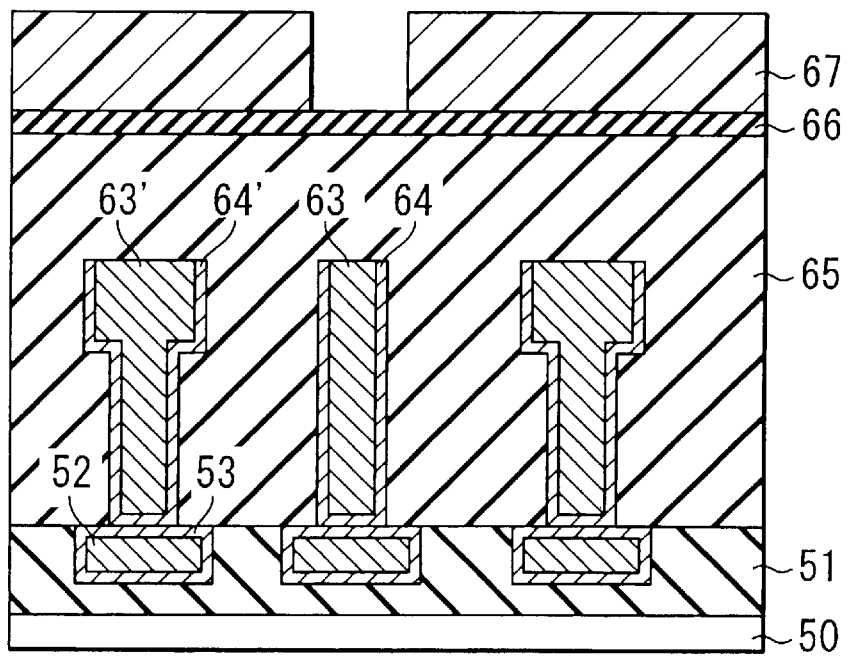

Thereafter, an interlayer insulating film 65 is deposited (FIG. 14A). Then, a reflection preventive film 66 and a resist layer 67 are formed by means of coating, after which the patterning of wiring is performed (FIG. 14B), and the interlayer insulating film 65 is worked to form a wiring groove (FIG. 15A). Thereafter, the reflection preventive film and the resist layer 67 are peeled away by making use of an asher (FIG. 15B). Again, a wiring material such as Al—Cu is buried and flattened by means of CMP to thereby form a metal wiring 68 made of aluminum for instance which is buried in the wiring groove and covered with a barrier metal 69 (FIG. 16). As a result, a wiring structure comprising wirings 63' and 68 which are disposed up and down alternately in the same wiring layer is obtained (FIG. 17). Further, it is possible to suppress the deterioration of propagation velocity of signals that may be brought about by an increasing miniaturization of intervals between wirings.

Although a polysilicon film is employed as a hard mask in this embodiment, it is also possible in the present invention to employ an insulating film such as a SiON film, a SiC film, an $Al_2O_3$ film, a $WO_3$ film, a $TiO_x$ film and a SiN film; or a metal film such as a W film, a WSi film, a Ti film, a TiN film, a Nb film, an Al film, an Al—Si—Cu film, an Al—Cu film, etc. Further, although a silicon oxide film is employed as an interlayer insulating film in this embodiment, it is also possible in the present invention to employ an organic silicon oxide film or an inorganic silicon oxide film.

Next, a fourth embodiment of the present invention will be explained with reference to FIGS. 18A and 18B and FIGS. 19A, 19B and 19C.

FIGS. 18A and 18B and FIGS. 19A, 19B and 19C are cross-sectional views illustrating the manufacturing process of a semiconductor device. In this embodiment, a process of forming a wiring pattern by making use of a hard mask and a resist as a mask is explained, wherein part of the underlying layer which is formed of a metal such as polysilicon, and another part of the underlying layer which is formed of an insulating film are worked respectively.

Referring to these FIGS. 18A and 18B and FIGS. 19A, 19B and 19C, an interlayer insulating film 71 made of a silicon oxide film is formed on the surface of a semiconductor substrate 70 such as a silicon semiconductor substrate, and a polysilicon film 72 is partially formed on the surface of the interlayer insulating film 71. In these FIGS. 18A and 18B and FIGS. 19A, 19B and 19C, the polysilicon film 72 is formed in the region A, and only the interlayer insulating film 71 is formed in the region B.

As a hard mask for the interlayer insulating film, a silicon nitride film 73 is employed. First of all, the silicon nitride film 73 is etched using a resist mask (not shown).

The etching conditions in this case are: 40 mTorr, 1400W and $CHF_3/CO$ mixed gas=50/100 sccm, under which an anisotropic etching is performed. As a result of working, a patterned silicon nitride film (hard mask) 73 is formed.

Then, after the resist is peeled away, a lower resist layer 74 is deposited to a thickness of about 700 nm over the patterned surfaces. Next, a SOG film 75 having a thickness of about 100 nm and an upper resist layer 79 having a thickness of about 300 nm are successively coated on the surface of the resist layer 74. Thereafter, upper resist layer 79 is patterned using the lower resist 74 as a reflection preventive film. In this case, this patterning may be performed by a process wherein a reflection preventive film is coated on the surface of the SOG film, and then, the resist is coated thereon and patterned.

Figure 18A:
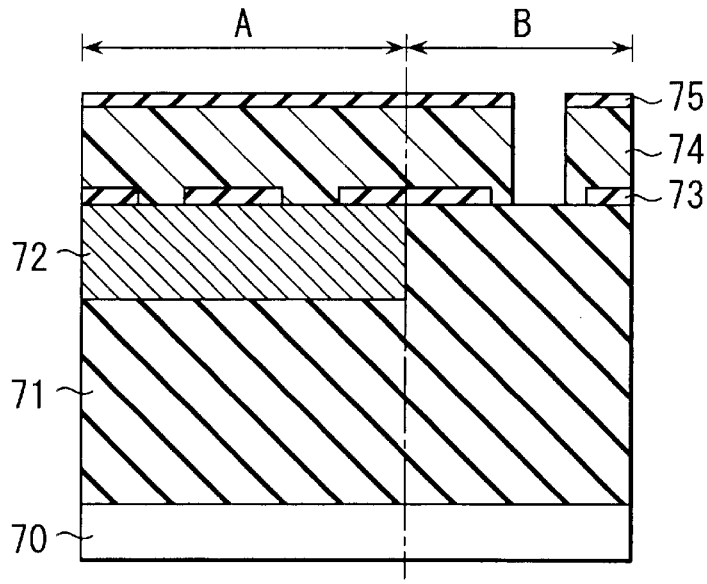
FIGS. 18A and 18B are cross-sectional views illustrating the manufacturing process of a semiconductor device according to a fourth embodiment of the present invention, wherein a process of forming a wiring pattern by making use of a hard mask and a resist as a mask is explained, wherein part of the underlying layer which is formed of a metal such as polysilicon, and another part of the underlying layer which is formed of an insulating film are worked respectively.

On this occasion, an upper resist layer 79 is employed as a mask for working the SOG film 75, and the SOG film 75 is employed as a mask for working a lower resist layer 74 in a subsequent step. The conditions for etching the SOG film 75 in this case are: 20 mTorr, 1000W and $CF_4/O_2$ mixed gas=60/10 sccm, under which an anisotropic etching is performed. On the other hand, the conditions for etching the lower resist layer 74 are: 40 mTorr, 500W and $N_2/O_2$ mixed gas=150/10 sccm, under which an anisotropic etching is performed. It is possible under this working condition of the lower resist layer to secure a selectivity of 100 or more relative to the SOG film, and also to secure a selectivity of 100 or more relative to the interlayer insulating film (FIG. 18A). Additionally, it is also possible to secure a selectivity of 100 or more relative to the polysilicon. Although a resist is employed for the portion identified by the number 74 in this embodiment, almost the same effect as obtainable in the above embodiment can be obtained by making use of a sputtered or coated carbon film, or the Low-k film containing no silicon such as flare, silk, etc.

Then, after the creation of these masks, a process for forming a contact hole 76 in the interlayer insulating film 71 is performed. The etching conditions in this case are: 20 mTorr, 1400W and $C_4F_8/CO/O_2/Ar$ mixed gas=10/50/5/100 sccm. Namely, under these working conditions, the interlayer insulating film 71 is subjected to an etching work.

Figure 18B:
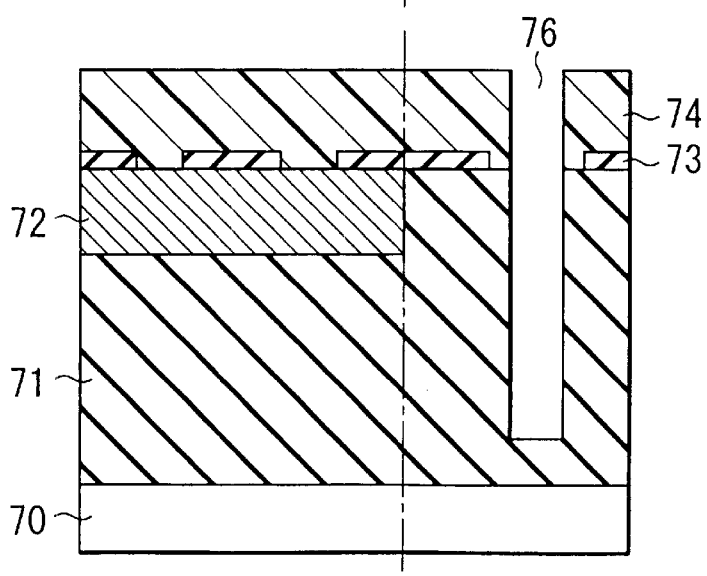
Figure 19A:
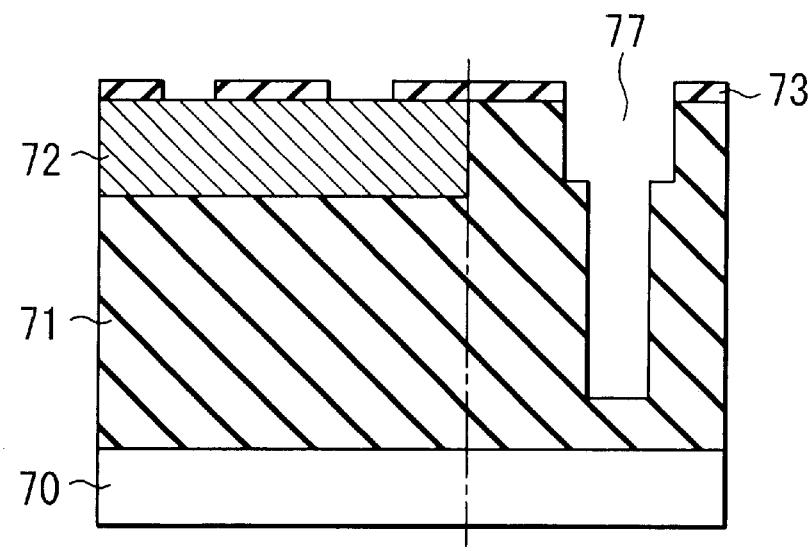
FIGS. 19A, 19B and 19C are cross-sectional views illustrating the manufacturing process of the semiconductor device according to the fourth embodiment of the present invention.
Figure 19B:
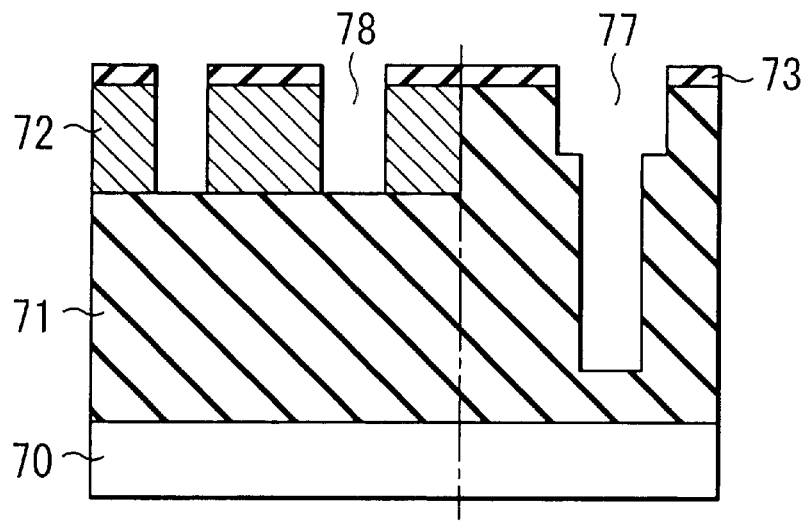
Figure 19C:
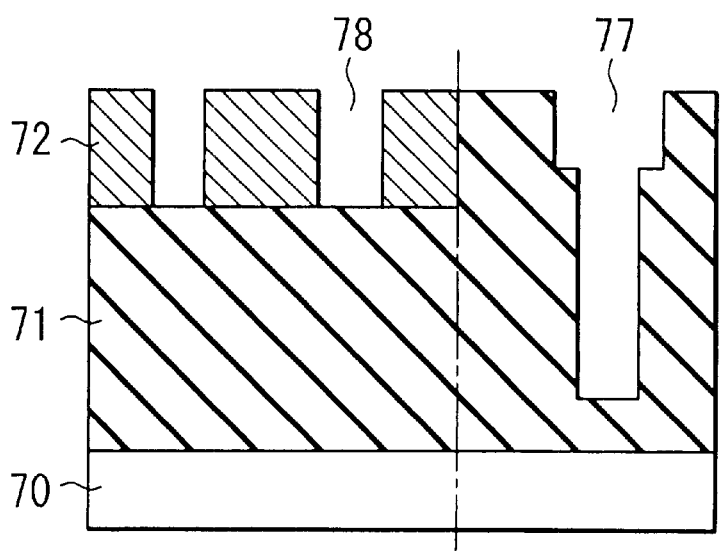

The selectivity between the resist and the interlayer insulating film under these etching conditions is about 15, while the selectivity between the resist and the SiN film under these etching conditions is about 30 (FIG. 18B). Then, the SOG film 75 and the lower resist 74 which are employed for working the interlayer insulating film 71 are peeled away by means of an $O_2$ RIE. Then, a wiring groove 77 is formed in the interlayer insulating film 71 by making use of the hard mask (silicon nitride film) 73. The etching conditions in this case are the same as those employed in the previous etching of the contact hole (FIG. 19A). Thereafter, grooves are formed in the polysilicon film by making use of the hard mask (SiN) 73. The etching conditions in this case are: 75 mTorr, 300W and $Cl/O_2$ mixed gas=75/10 sccm. Since the etching selectivity between the hard mask and the polysilicon in this case is as high as about 50. Under these conditions, the polysilicon film 72 is anisotropically etched. Since the etching selectivity between the interlayer insulating film and the polysilicon film is as high as about 100, the interlayer insulating film can be substantially prevented from being etched during this etching work of the polysilicon film 72 (FIG. 19B). Upon finishing the working of the polysilicon film, the hard mask (silicon nitride film) is removed by means of a wet treatment (hot phosphoric acid treatment) or by means of a CMP treatment (FIG. 19C).

By way of the method of this embodiment, underlying films of various kinds which are formed on the surface of semiconductor substrate can be easily and simultaneously worked.

The underlying interlayer insulating film and polysilicon film may be employed for forming the contact hole or other kinds of pattern. Further, although a silicon oxide film is employed as an interlayer insulating film in this embodiment, it is also possible in the present invention to employ an organic silicon oxide film or an inorganic silicon oxide film and work them in the same manner as explained above. Additionally, although polysilicon is employed as a metal film in this embodiment, a metal which is capable of exhibiting an excellent selectivity relative to the material of the interlayer insulating film can be employed, specific embodiments of such a metal being W, WSi, Al, Al—Cu, Al—Si—Cu, Ru, Ti, TiN, Ag, etc.

According to this embodiment, the resist film and the SOG film are successively formed through coating method after the working of a hard mask, and then, the resist film is patterned and at the same time, the SOG film and the resist are selectively worked by means of RIE, thereby enabling two different kinds of mask to be formed on a wafer, enabling the hard mask to be totally incorporated within the resist film, or enabling the hard mask to be partially incorporated within the resist film. As a result, it becomes possible to easily form two kinds of pattern, or to easily form one kind of pattern at a portion of wafer and two kinds of pattern at another portion of wafer. By the way, it is also possible in the present invention to form a reflection preventive film on the surface of the SOG film.

Although two kinds of work are applied to an insulating film or to a metal film in conformity with the masks of various kinds in the above embodiment, it is also possible to apply the method of the present invention to the working of three or more kinds.

Next, a fifth embodiment of the present invention will be explained with reference to FIGS. 20A, 20B and 20C to FIGS. 22A and 22B.

Figure 20A:
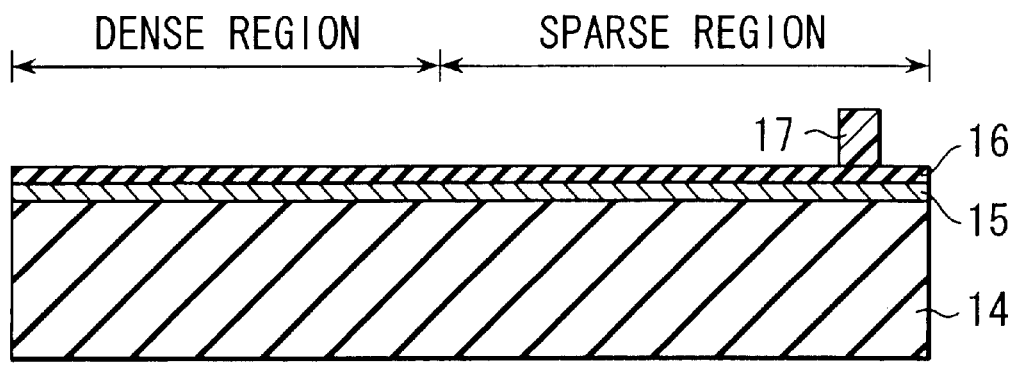
FIGS. 20A, 20B and 20C are cross-sectional views illustrating the manufacturing process of a semiconductor device according to a fifth embodiment of the present invention.
Figure 20B:
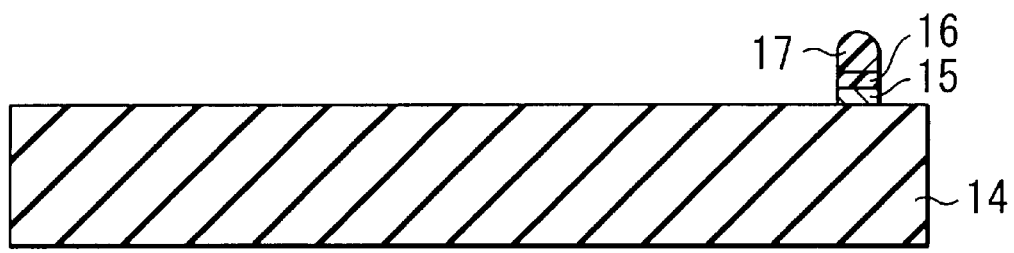
Figure 20C:
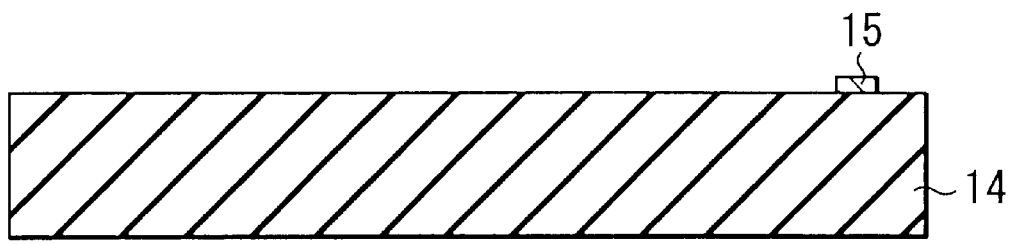

FIGS. 20A, 20B and 20C to FIGS. 22A and 22B are cross-sectional views illustrating the manufacturing process of a semiconductor device. Referring to these FIGS. 20A, 20B and 20C to FIGS. 22A and 22B, a polysilicon film 15 is employed for forming a hard mask for an interlayer insulating film 14 which is formed on a semiconductor device (not shown). Namely, the polysilicon film 15 is worked using a resist mask so as to form a groove. On this occasion, the groove is formed exclusively at the portion of isolated pattern by adjusting the dose of light to that to be applied to the sparse pattern region. Then, the resist film 17 is patterned into the shape of wiring groove, and the resultant pattern is employed as a mask for etching the reflection preventive film 16. Then, the resist film 17 thus patterned is employed as a mask for etching the polysilicon film 15 (FIG. 20B). The conditions for etching the polysilicon film 15 are: 75 mTorr, 300W and $Cl/O_2$ mixed gas=75/10 sccm, under which an anisotropic etching (RIE) is performed. Since the etching selectivity between the interlayer insulating film and the polysilicon in this case is as high as about 100, the interlayer insulating film 14 acts as a stopper, thereby preventing the interlayer insulating film from being excessively etched away. This is very advantageous in terms of the controllability of working depth of wiring grooves.

Then, after the resist 17 and the reflection preventive film 16 are peeled away (FIG. 20C), a resist 18 is deposited to a thickness of about 700 nm over the patterned surfaces consisting of polysilicon film 15 and the interlayer insulating film 14. Next, a SOG (Spin on Glass) film 19 is deposited to a thickness of about 100 nm on the surface of the resist 18, and then, a resist 20 is coated to a thickness of about 300 nm on the SOG film 19.

Figure 21A:
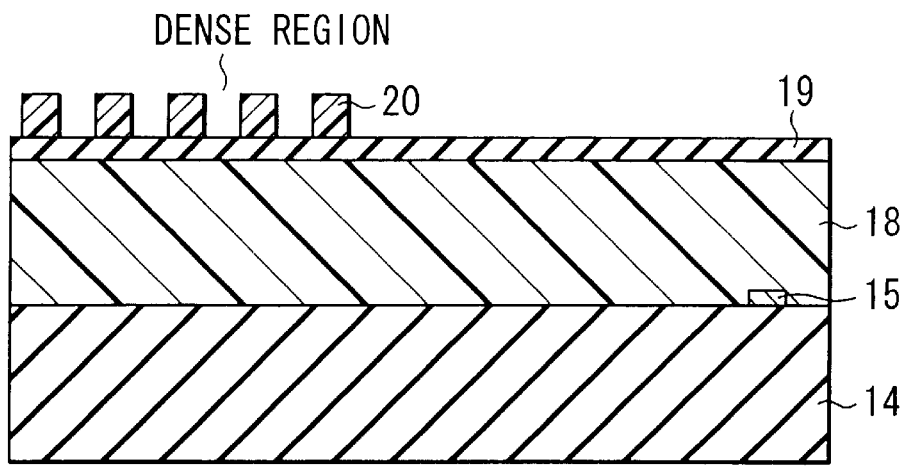
FIGS. 21A, 21B and 21C are cross-sectional views illustrating the manufacturing process of the semiconductor device according to the fifth embodiment of the present invention.

In this case, the SOG film is formed by a process wherein silanol $(Si(OH)_4)$ is dissolved in alcohol to obtain a solution which is coated on the substrate while rotating the substrate, and the resultant coated layer is subsequently baked at a temperature of about 200 to 300° C. to obtain the SOG film 19. Thereafter, the resist 20 is patterned into the groove shape using the resist 18 as a reflection preventive film. On this occasion, the dose of light is adjusted to that to be applied to the dense pattern (FIG. 21A). Alternatively, this patterning may be performed by a process wherein a reflection preventive film is coated on the surface of the SOG film, and then, the resist 20 is coated thereon to form a resist layer which is then patterned to form the contact holes.

Figure 21B:
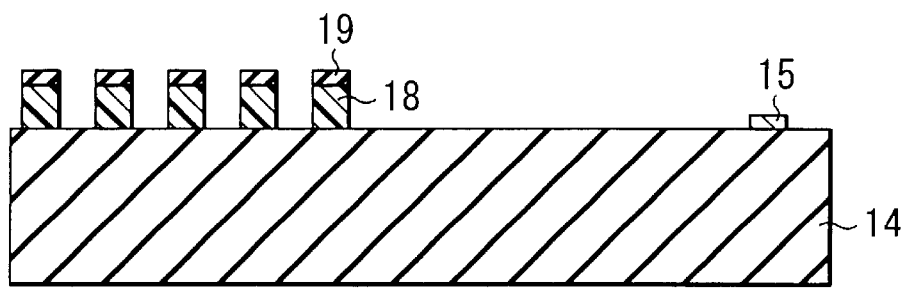

On this occasion, an upper resist film 20 thus patterned is employed as a mask for etching the SOG film 19. Thereafter, the mask consisting of this SOG film 19 is employed for working a lower resist film 18. The conditions for etching the SOG film 19 in this case are: 20 mTorr, 1000W and $CF_4/O_2$ mixed gas=60/20 sccm, under which an anisotropic etching is performed. On the other hand, the conditions for etching the lower resist layer 18 are: 40 mTorr, 400W and $N_2/O_2$ mixed gas=100/10 sccm, under which a selectivity of 100 or more relative to the SOG film 19 can be secured. It is also possible to secure a selectivity of 100 or more relative to the interlayer insulating film 14. By way of this patterning, the mask pattern for the contact hole is formed (FIG. 21B). Although a resist is employed for the portion of the lower resist 18 in this embodiment, almost the same effect as obtainable in the above embodiment can be obtained by making use of a sputtered or coated carbon film, or the Low-k film containing no silicon such as flare, silk, etc.

Please note that, in FIG. 21B, the lower resist 18 is shown thinner than in FIG. 21A.

Figure 21C:
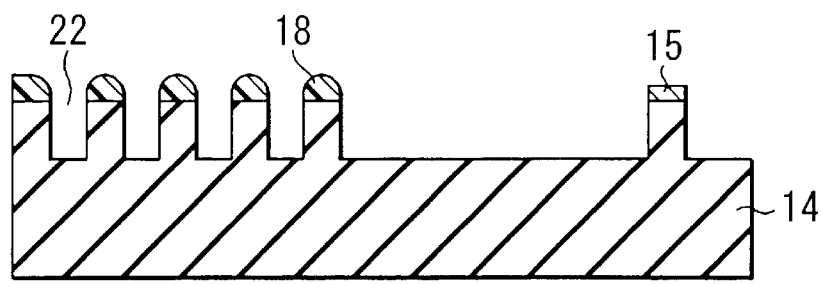

Then, by making use of these resist film and polysilicon film 15 as a mask, the work for forming a groove having a depth of about 400 nm is performed. The etching conditions in this case are: 20 mTorr, 1400W and $C_4F_8/CO/O_2/Ar$ mixed gas=10/50/5/100 sccm, which conditions enabling to secure an etching selectivity of about 40 relative to the polysilicon. As a result, the work for forming wiring grooves of dense pattern region as well as sparse pattern region can be performed with an excellent controllability, thus forming the grooves 22 (FIG. 21C).

Figure 22A:
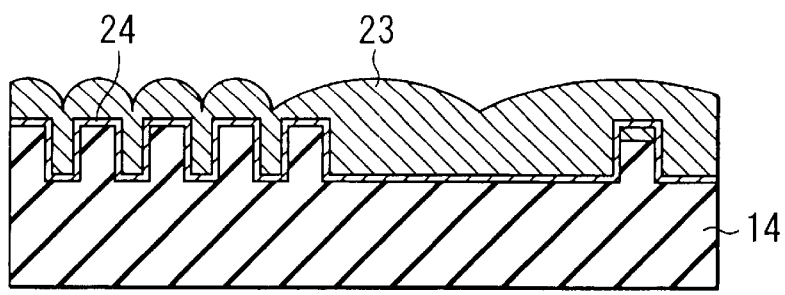
FIGS. 22A and 22B are cross-sectional views illustrating the manufacturing process of the semiconductor device according to the fifth embodiment of the present invention.
Figure 22B:
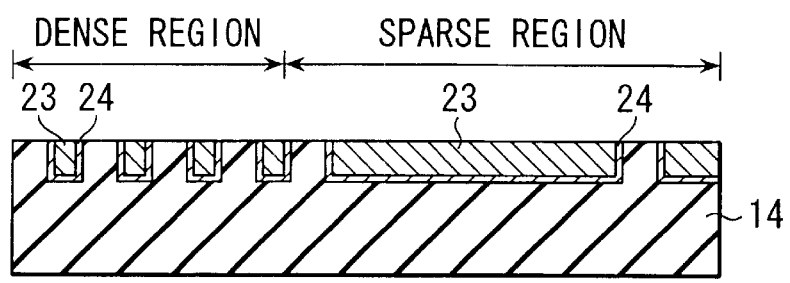

Thereafter, a barrier metal such as TiN is deposited over the resultant surface, and then, Al is deposited thereon to form an Al film (FIG. 22A), which is subsequently flattened by means of a CMP to form a metal wiring (aluminum wiring) 23 in the wiring groove, the metal wiring 23 being covered with the barrier metal 24 such as TiN (FIG. 22B). With regard to the material for this wiring, it is also possible to create this wiring by a process wherein an Nb liner is deposited at first, and then, a conductive material such as Al, Al—Si—Cu, Al—Cu, Cu or Ag is deposited thereon to form the wiring.

Although a polysilicon film is employed as a hard mask in this embodiment, it is also possible in the present invention to employ an insulating film such as a SiON film, a SiC film, an $Al_2O_3$ film, a $WO_3$ film, a $TiO_x$ film and a SiN film; or a metal film such as a W film, a WSi film, a Ti film, a Nb film, an Al film, an Al—Si—Cu film, an Al—Cu film, a TiN film, etc. Further, although a silicon oxide film is employed as an interlayer insulating film in this embodiment, it is also possible in the present invention to employ an organic silicon oxide film or an inorganic silicon oxide film. Further, although the wiring is formed at the portion of the hard mask in this embodiment, a contact hole pattern or other kinds of pattern may be formed at this portion of the hard mask. Although the working of insulating film is exemplified in this embodiment, the working of metal film can be performed in the same manner as described above. In this case, it is possible to employ, as a hard mask, an insulating film such as a SiON film, a SiC film, an $Al_2O_3$ film, a $WO_3$ film, a $TiO_x$ film and a SiN film; or a metal film such as a TiN film.

According to this embodiment, after finishing the work of forming the hard mask, the resultant hard mask is enabled to be totally incorporated within the resist film. As a result, it becomes possible to create various worked shapes within a semiconductor chip with excellent controllability.

Further, in this embodiment, the working of hard mask is performed using an isolated pattern, and then, a resist mask is formed in a dense pattern region to perform an etching work. However, the dense pattern region may be worked at first using a hard mask, and then, a resist mask may be employed for working the sparse pattern region. Although the work for forming grooves is discussed in this embodiment, contact holes, a pattern of island shape or any other kinds of pattern can be formed in the same manner as described above.

Next, a sixth embodiment of the present invention will be explained with reference to FIGS. 23A and 23B to FIGS. 27A and 27B.

Figure 25A:
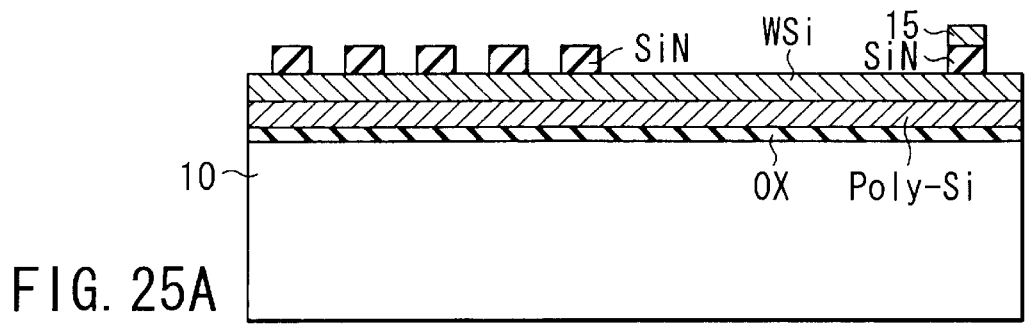
FIGS. 25A and 25B are cross-sectional views illustrating the manufacturing process of the semiconductor device according to the sixth embodiment of the present invention.
Figure 25B:
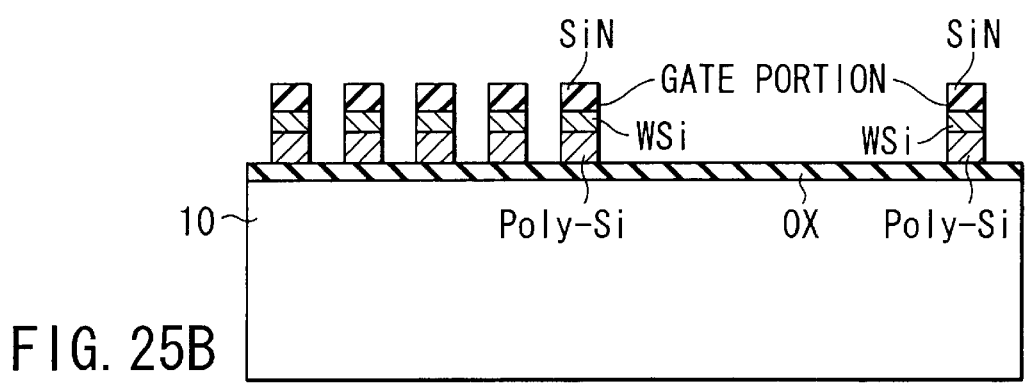
Figure 26A:
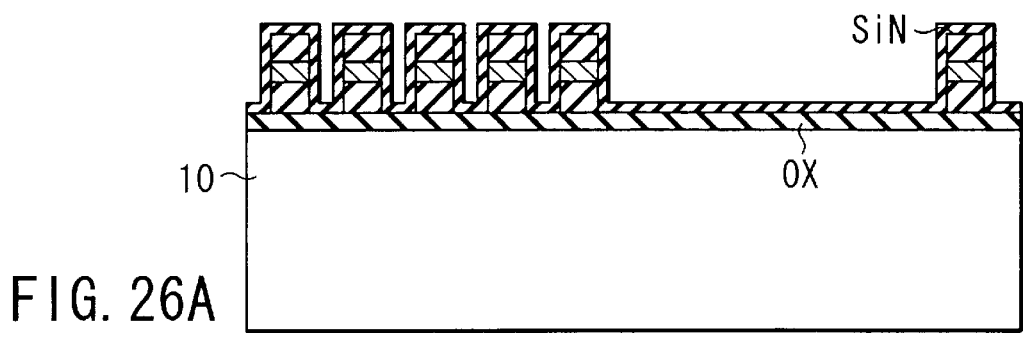
FIGS. 26A and 26B are cross-sectional views illustrating the manufacturing process of the semiconductor device according to the sixth embodiment of the present invention.
Figure 26B:
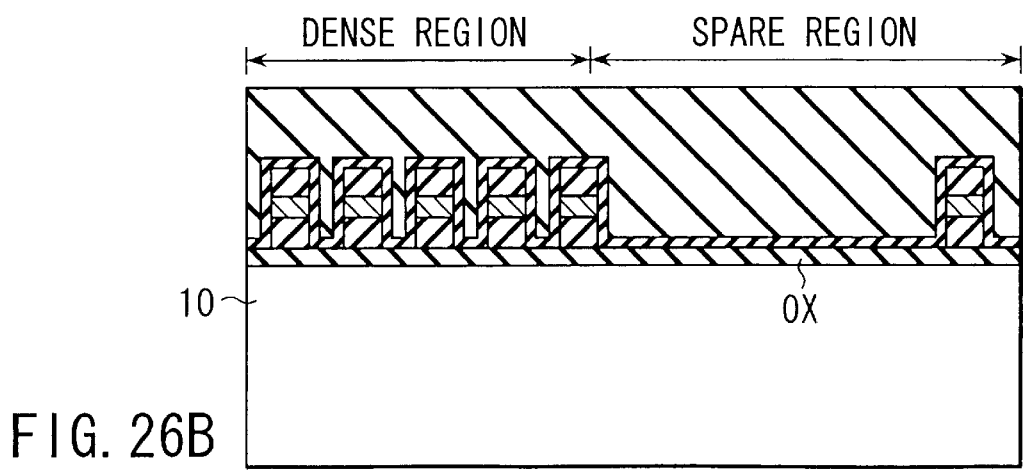
Figure 27A:
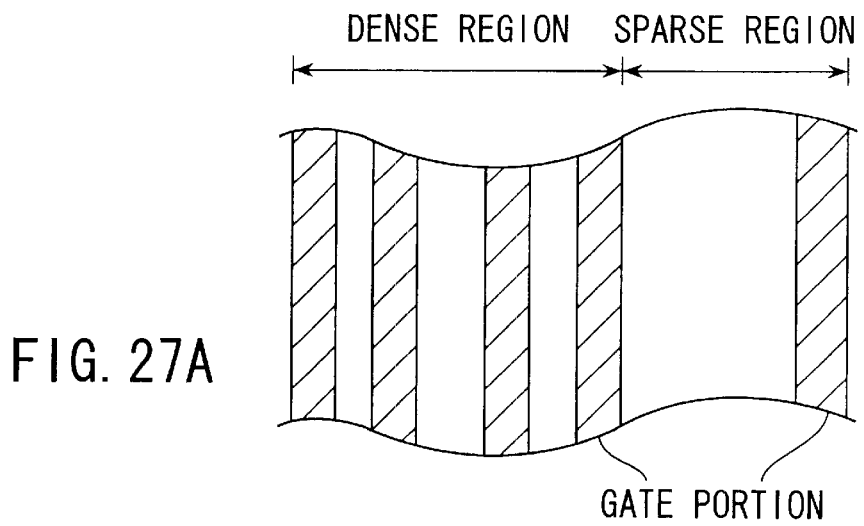
FIG. 27A shows a plan view of the surface of the gate portion of the semiconductor device shown in FIG. 26B.
Figure 27B:
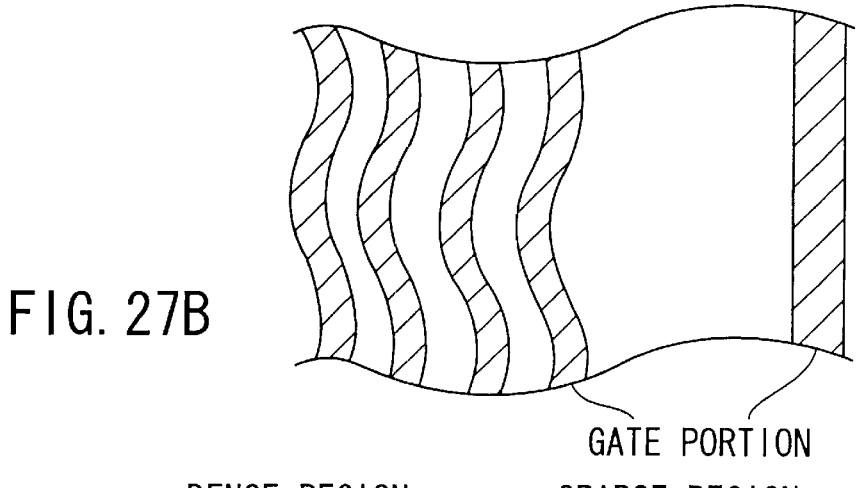
FIG. 27B shows a plan view of the surface of a modification of the gate portion shown in FIG. 27A.

FIGS. 23A and 23B to FIGS. 26A and 26B are cross-sectional views illustrating the manufacturing process of a semiconductor device. FIG. 27A shows a plan view of the surface of the gate portion. In this embodiment, a semiconductor device is formed in such a manner that it includes a dense pattern region of gate where gate is densely disposed and a sparse pattern region of gate where gate is sparsely disposed. FIG. 27B shows a plan view of another example of the gate portion shown in FIG. 27A.

Figure 23A:
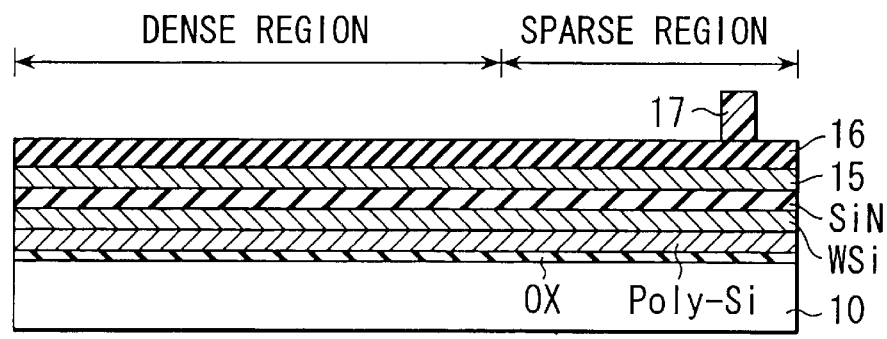
FIGS. 23A and 23B are cross-sectional views illustrating the manufacturing process of a semiconductor device according to a sixth embodiment of the present invention, wherein a semiconductor device is formed in such a manner that the semiconductor device includes a dense pattern region of gate where gate is densely disposed and a sparse pattern region of gate where gate is sparsely disposed.
Figure 23B:
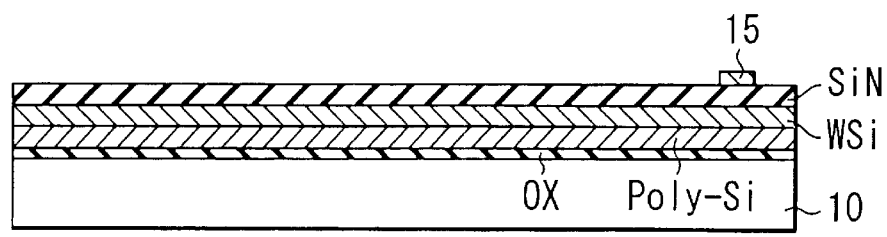

Referring to these FIGS. 23A and 23B to FIGS. 26A and 26B, a gate oxide film (OX), a polysilicon film, a WSi film and an SiN film are successively formed on the surface of a semiconductor substrate 10, and then, a polysilicon film 15 and a reflection preventive film 16 which are to be employed as a hard mask are deposited on the surface of the SiN film. Thereafter, the polysilicon film 15 is worked using a resist mask 17 so as to form a groove. On this occasion, the pattern is formed exclusively at the portion of isolated pattern by adjusting the dose of light to that to be applied to the sparse pattern region (isolated region). Then, the resist film 17 is patterned into the shape of wiring groove (FIG. 23A), and the resultant pattern is employed as a mask for etching the reflection preventive film 16. Then, the resist film 17 thus patterned is employed as a mask for etching the polysilicon film 15 (FIG. 23B). The conditions for etching the polysilicon film 15 are: 75 mTorr, 300W and $Cl/O_2$ mixed gas=75/10 sccm, under which an anisotropic etching (RIE) is performed. Since the etching selectivity between the interlayer insulating film and the polysilicon in this case is as high as about 100, the interlayer insulating film 14 acts as a stopper, thereby preventing the interlayer insulating film from being excessively etched away. This is very advantageous in terms of the controllability of working depth of wiring grooves.

Then, after the resist 17 and the reflection preventive film 16 are peeled away (FIG. 24A), a resist 18 is deposited to a thickness of about 700 nm over the patterned surfaces consisting of polysilicon film 15 and the interlayer insulating film 14. Next, a SOG film 19 is deposited to a thickness of about 100 nm on the surface of the resist 18, and then, a resist 20 is coated to a thickness of about 300 nm on the SOG film 19.

In this case, the SOG film is formed by a process wherein silanol $(Si(OH)_4)$ is dissolved in alcohol to obtain a solution which is coated on the substrate while rotating the substrate, and the resultant coated layer is subsequently baked at a temperature of about 200 to 300° C. to obtain the SOG film 19.

Figure 24A:
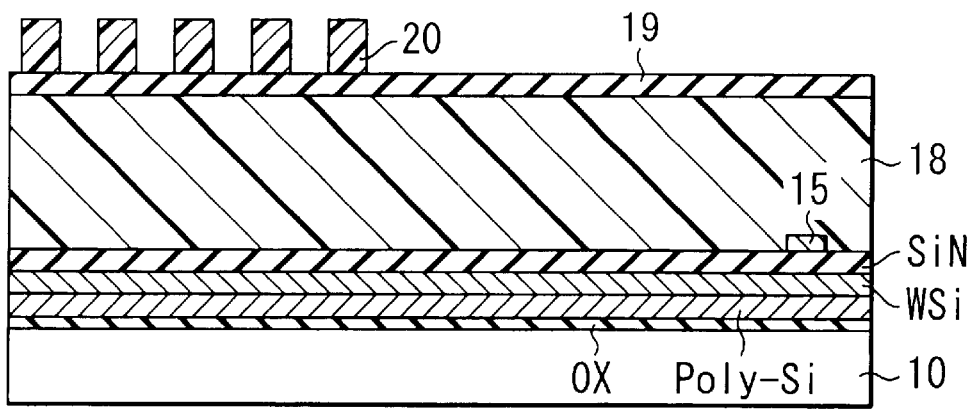
FIGS. 24A, 24B and 24C are cross-sectional views illustrating the manufacturing process of the semiconductor device according to the sixth embodiment of the present invention.
Figure 24B:
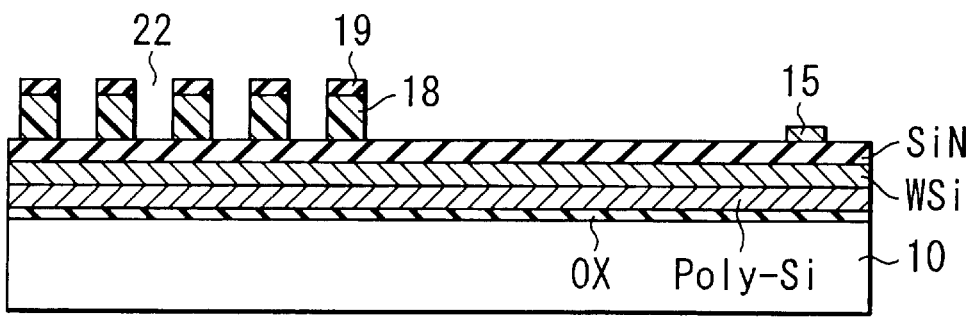

Thereafter, by adjusting the dose of light to that to be applied to the dense pattern region of groove, the resist 20 is patterned with the resist 18 being employed as a reflection preventive film, thereby forming grooves of the dense pattern region (FIG. 24B). Alternatively, this patterning may be performed by a process wherein a reflection preventive film is coated on the surface of the SOG film, and then, the resist 20 is coated thereon to form a resist layer which is then patterned to form the grooves.

Figure 24C:
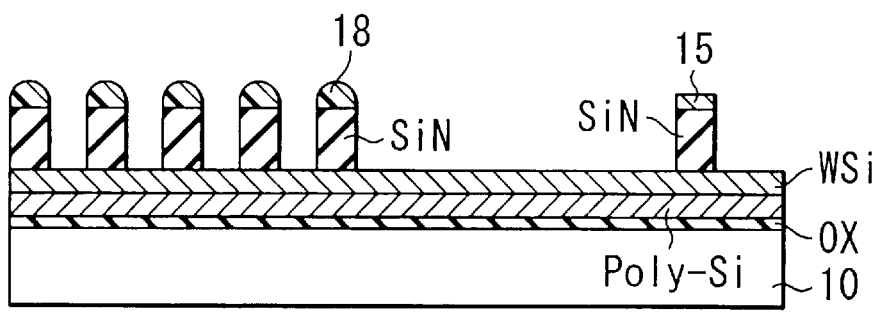

Next, the patterning of groove is performed using the SOG film 19 as a reflection preventive film. On this occasion, an upper resist film 20 thus patterned is employed as a mask for etching the SOG film 19. Thereafter, the mask consisting of this SOG film 19 is employed for working a lower resist film 18. The conditions for etching the SOG film 19 in this case are: 20 mTorr, 1000W and $CF_4/O_2$ mixed gas=60/10 sccm, under which an anisotropic etching is performed. On the other hand, the conditions for etching the lower resist layer 18 are: 40 mTorr, 400W and $N_2/O_2$ mixed gas=100/20 sccm, under which a selectivity of 100 or more relative to the SOG film 19 can be secured. It is also possible to secure a selectivity of 100 or more relative to the interlayer insulating film 14. By way of this patterning, the mask pattern for the groove is formed (FIG. 24C). Although a resist is employed for the portion of the lower resist 18 in this embodiment, almost the same effect as obtainable in the above embodiment can be obtained by making use of a sputtered or coated carbon film, or the Low-k film containing no silicon such as flare, silk, etc.

Note that, in FIG. 24B, the lower resist 18 is shown thinner than in FIG. 24A.

Then, by making use of these resist film 18 and polysilicon film 15 as a mask, the work for forming the gate portion is performed. The etching conditions for working the SiN film in this case are: 20 mTorr, 1400W and $CF_4/O_2/Ar$ mixed gas=100/10/100 sccm, which conditions enabling to secure an etching selectivity of about 20 relative to the polysilicon. As a result, the work for forming the gate portions of dense pattern region as well as sparse pattern region can be performed with an excellent controllability, thus forming the gate structures (FIG. 25A).

In FIG. 24C, the silicon nitride (SiN) film is shown thicker than in FIGS. 24A and 24B.

Thereafter, after the peeling of the resist film, the WSi film and the polysilicon film are selectively etched away by making use of this worked SiN film as a mask (FIG. 25B). The etching conditions in this case are: 75 mTorr, 300W and $Cl/O_2$ mixed gas=75/10 sccm, which conditions enable the etching selectivity relative to SiN film to become as high as about 50, and also enable the etching selectivity relative to $SiO_2$ film to become as high as about 100. Under these conditions, the polysilicon hard mask located in the sparse pattern region is allowed to be etched during the working of the WSi film and the polysilicon film. Upon finishing the working of the gate portion, the gate portion is covered and protected with an SiN film (FIG. 26A), and then, an interlayer insulating film (silicon oxide film) is deposited, the resultant body being further treated in the subsequent steps (FIG. 26B). The surface of the gate portion is shown in a plan view in FIG. 27A. Another example of the gate portion shown in FIG. 27A is shown in FIG. 27B.

Although a polysilicon film is employed as a hard mask in this embodiment, it is also possible in the present invention to employ an insulating film such as a SiC film, an $Al_2O_3$ film, a $WO_3$ film, a $TiO_x$ film and a SiN film; or a metal film such as a W film, a WSi film, a Ti film, a Nb film, an Al film, an Al—Si—Cu film, an Al—Cu film, a TiN film, etc. Further, although a silicon oxide film is employed as an interlayer insulating film in this embodiment, it is also possible in the present invention to employ an organic silicon oxide film or an inorganic silicon oxide film. Further, although the wiring is formed at the portion of the hard mask in this embodiment, a contact hole pattern or other kinds of pattern may be formed at this portion of the hard mask.

According to this embodiment, after finishing the work of forming the hard mask, the work of forming the mask of resist is performed, whereby the resultant hard mask is enabled to be totally incorporated within the resist film. As a result, it becomes possible to create various worked shapes within a semiconductor chip with excellent controllability.

Further, in this embodiment, the working of hard mask is performed using an isolated pattern for a sparse pattern region, and then, a resist mask is formed in a dense pattern region to perform an etching work. However, the dense pattern region may be worked at first using a hard mask, and then, a resist mask may be employed for working the sparse pattern region.

Next, a seventh embodiment of the present invention will be explained with reference to FIGS. 28A and 28B to FIGS. 31A, 31B and 31C.

Figure 30A:
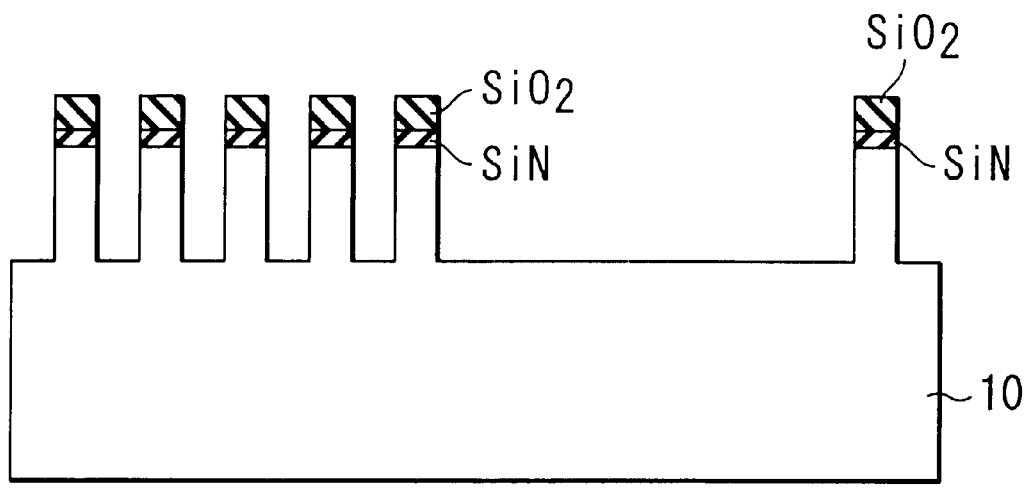
FIGS. 30A and 30B are cross-sectional views illustrating the manufacturing process of the semiconductor device according to the seventh embodiment of the present invention.
Figure 30B:
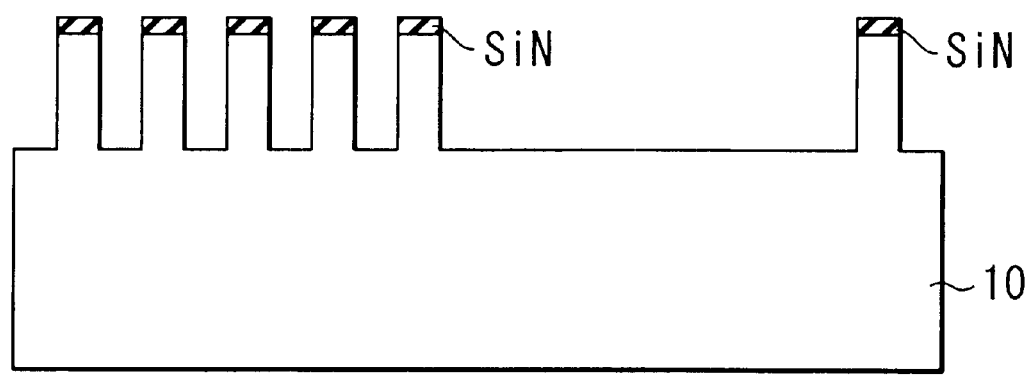
Figure 31A:
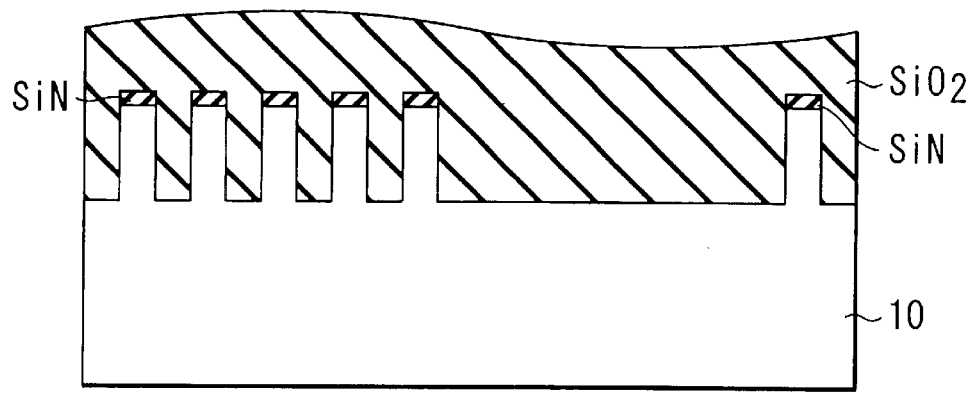
FIGS. 31A and 31B are cross-sectional views illustrating the manufacturing process of the semiconductor device according to the seventh embodiment of the present invention.
Figure 31B:
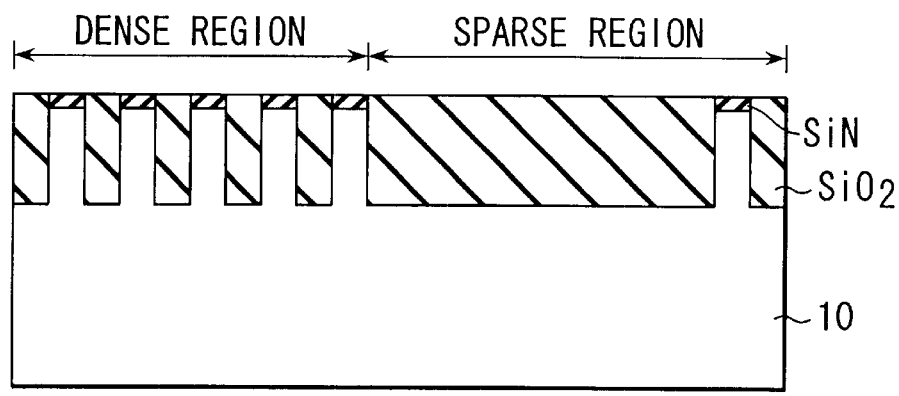
Figure 32:
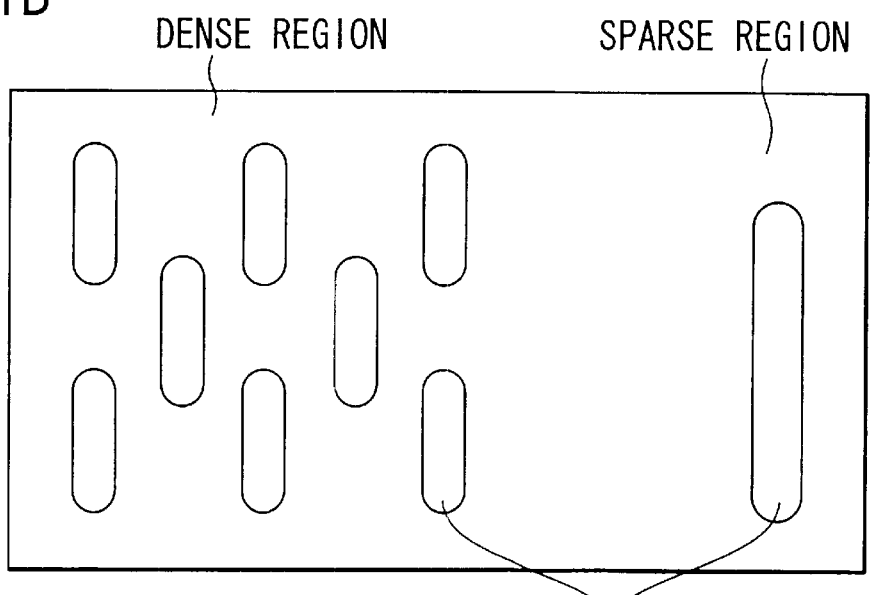
FIG. 32 shows a plan view of the semiconductor substrate shown in FIG. 31B, wherein the semiconductor device is provided with a sparsely patterned element isolation region and a densely patterned element isolation region.

This embodiment illustrates a semiconductor device which is provided with a sparsely patterned element isolation region and a densely patterned element isolation region. FIGS. 28A and 28B to FIGS. 31A and 31B are cross-sectional views illustrating the manufacturing process for forming element isolation regions by making use of a hard mask and a resist. FIG. 32 shows a plan view of the semiconductor substrate 10.

Figure 28A:
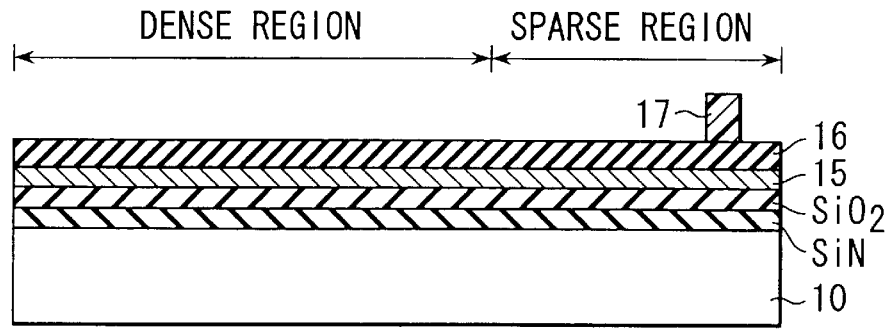
FIGS. 28A and 28B are cross-sectional views illustrating the manufacturing process of a semiconductor device according to a seventh embodiment of the present invention, illustrating the manufacturing process for forming element isolation regions by making use of a hard mask and a resist.
Figure 28B:
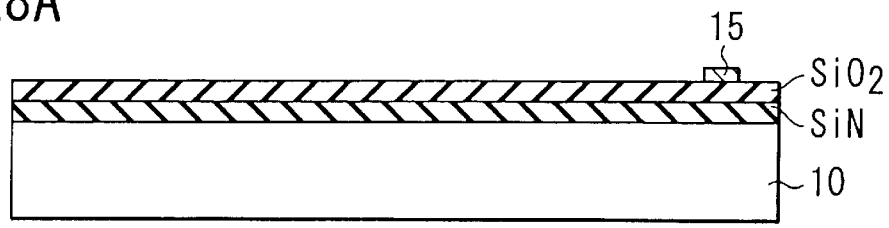

Referring to these FIGS. 28A and 28B to FIGS. 31A and 31B, a silicon nitride film (SiN film) and a silicon oxide film ($SiO_2$ film) are successively deposited on the surface of a semiconductor substrate 10. It is also possible, depending on the end-use, to deposit only the silicon nitride film in this case. Then, a polysilicon film 15 is employed as a hard mask. Thereafter, the polysilicon film 15 is worked using a resist mask so as to form a groove. On this occasion, the pattern is formed exclusively at the portion of isolated pattern by adjusting the dose of light to that to be applied to the sparse pattern region (isolated region). Then, the resist film 17 is patterned into the shape of wiring groove, and the resultant pattern is employed as a mask for etching the reflection preventive film 16. Then, the resist film 17 thus patterned is employed as a mask for etching the polysilicon film 15 (FIG. 28B). The conditions for etching the polysilicon film 15 are: 75 mTorr, 300W and $Cl/O_2$ mixed gas=75/10 sccm, under which an anisotropic etching (RIE) is performed. Since the etching selectivity between the interlayer insulating film and the polysilicon in this case is as high as about 100, the interlayer insulating film 14 acts as a stopper, thereby preventing the interlayer insulating film from being excessively etched away. This is very advantageous in terms of the controllability of working depth of wiring grooves.

Then, after the resist 17 and the reflection preventive film 16 are peeled away (FIG. 29A), a resist 18 is deposited to a thickness of about 700 nm over the patterned surfaces consisting of polysilicon film 15 and the interlayer insulating film 14. Next, a SOG film 19 is deposited to a thickness of about 100 nm on the surface of the resist 18, and then, a resist 20 is coated to a thickness of about 300 nm on the SOG film 19.

In this case, the SOG film is formed by a process wherein silanol ($Si(OH)_4$) is dissolved in alcohol to obtain a solution which is coated on the substrate while rotating the substrate, and the resultant coated layer is subsequently baked at a temperature of about 200 to 300° C. to obtain the SOG film 19.

Figure 29A:
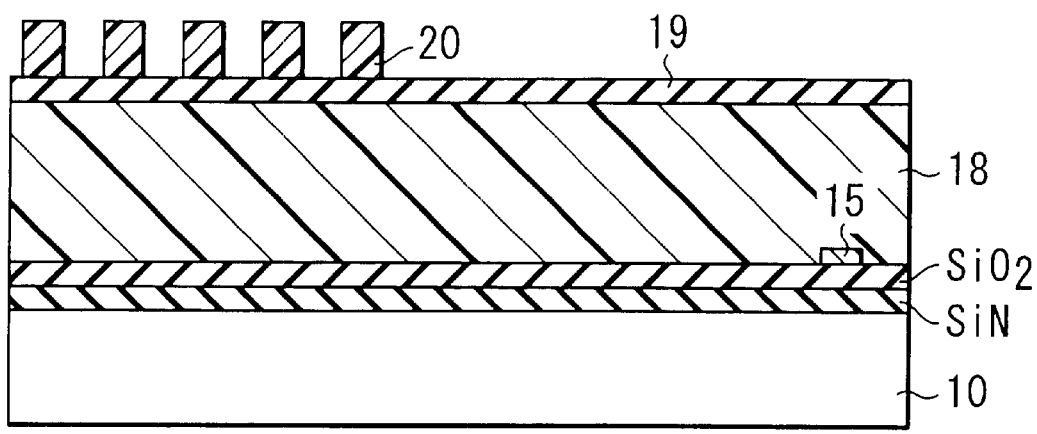
FIGS. 29A, 29B and 29C are cross-sectional views illustrating the manufacturing process of the semiconductor device according to the seventh embodiment of the present invention.
Figure 29B:
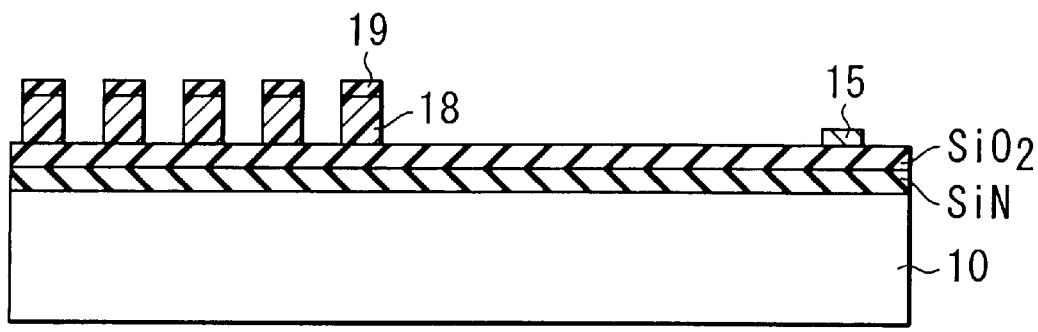

Thereafter, by adjusting the dose of light to that to be applied to the dense pattern region of groove, the resist 20 is patterned with the resist 18 being employed as a reflection preventive film, thereby forming grooves having a shape of contact hole in the dense pattern region (FIG. 29B). Alternatively, this patterning may be performed by a process wherein a reflection preventive film is coated on the surface of the SOG film, and then, the resist 20 is coated thereon to form a resist layer which is then patterned to form the grooves having a shape of contact hole.

Figure 29C:
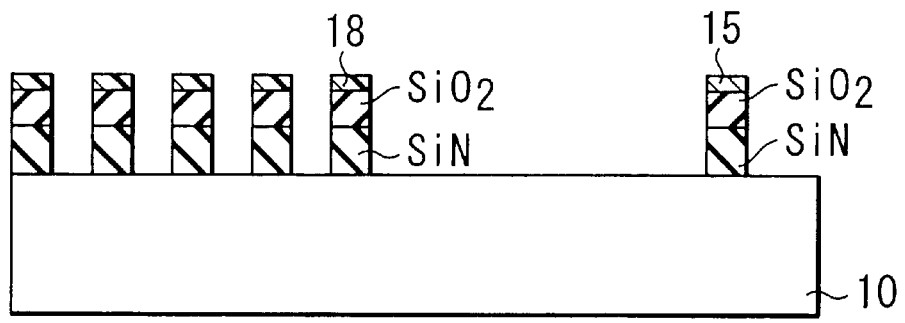

On this occasion, an upper resist film 20 thus patterned is employed as a mask for etching the SOG film 19. Thereafter, the mask consisting of this SOG film 19 is employed for working a lower resist film 18. The conditions for etching the SOG film 19 in this case are: 20 mTorr, 1000W and $CF_4/O_2$ mixed gas=60/10 sccm, under which an anisotropic etching is performed. On the other hand, the conditions for etching the lower resist layer 18 are: 40 mTorr, 400W and $N_2/O_2$ mixed gas=100/20 sccm, under which a selectivity of 100 or more relative to the SOG film 19 can be secured. It is also possible to secure a selectivity of 100 or more relative to the interlayer insulating film 14. By way of this patterning, the mask pattern for the contact hole is formed (FIG. 29C).

In FIG. 29B, the lower resist 18 is shown thinner than in FIG. 29A.

Although a resist is employed for the portion of the lower resist 18 in this embodiment, almost the same effect as obtainable in the above embodiment can be obtained by making use of a sputtered or coated carbon film, or the Low-k film containing no silicon such as flare, silk, etc.

Then, by making use of these resist film 18 and polysilicon film 15 as a mask, the element isolation regions (in the shape of island) are formed. The etching conditions for forming the element isolation regions in this case are: 20 mTorr, 1400W and $CF_4/O_2/Ar$ mixed gas=100/10/100 sccm, under which conditions the silicon oxide film and the silicon nitride film are worked. Further, these etching conditions enable to secure an etching selectivity of about 20 relative to the polysilicon. As a result, the work for forming the wirings of dense pattern region as well as sparse pattern region can be performed with an excellent controllability, thus forming the element isolation regions (in the shape of island) (FIG. 30A).

In FIG. 29C, the silicon oxide ($SiO_2$) film and the silicon nitride (SiN) film are shown thicker than in FIGS. 29A and 29B.

Thereafter, by making use of these silicon oxide and silicon nitride films as a mask, the semiconductor substrate 10 is etched to a depth of about 300 nm. The etching conditions in this case are: 20 mTorr, 600W and $Cl/O_2/CF_4$ mixed gas=75/10/8 sccm, which conditions enable the etching selectivity relative to $SiO_2$ film to become as high as about 20. On this occasion, the polysilicon hard mask 15 located in the sparse pattern region is allowed to be etched during the working of the semiconductor substrate 10. Upon finishing the working of the semiconductor substrate 10, the $SiO_2$ film is removed by making use of dilute hydrofluoric acid (HF) (FIG. 30B), and then, a silicon oxide film (it may be an organic silicon oxide film or an inorganic silicon oxide film) is deposited (FIG. 31A), and flattened by means of CMP (FIG. 31B). As a result, the silicon oxide film is buried in the grooves of the sparse pattern region as well as of the dense pattern region of the semiconductor substrate 10, thereby forming element isolation regions. FIG. 32 shows a plan view of the semiconductor substrate 10.

Although a polysilicon film is employed as a hard mask in this embodiment, it is also possible in the present invention to employ an insulating film such as a SiC film, an $Al_2O_3$ film, a $WO_3$ film, a $TiO_x$ film and a SiN film; or a metal film such as a W film, a WSi film, a Ti film, a Nb film, an Al film, an Al—Si—Cu film, an Al—Cu film, a TiN film, etc. Further, although a silicon oxide film is employed as an interlayer insulating film in this embodiment, it is also possible in the present invention to employ an organic silicon oxide film or an inorganic silicon oxide film. Further, although the wiring is formed at the portion of the hard mask in this embodiment, a contact hole pattern or other kinds of pattern may be formed at this portion of the hard mask.

In this embodiment, the working of hard mask is performed using an isolated pattern for a sparse pattern region, and then, a resist mask is formed in a dense pattern region to perform an etching work. However, the dense pattern region may be worked at first using a hard mask, and then, a resist mask may be employed for working the sparse pattern region.

As explained above, since the present invention is constructed as described above, every portions of semiconductor chip can be shaped into different worked shapes with an excellent controllability, and at the same time, even if an underlying film which is partially constituted by a different kind of film is existed in the chip, it can be worked with a sufficient controllability. Additionally, it is also possible to optionally form the wirings of the same wiring layer in the chip in such a manner that some of the wirings are disposed at a different level from that of other wirings.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, which comprises the steps of:

forming an insulating film or a metal film on a surface of a semiconductor substrate;

forming at least two kinds of masks each having an opening on a surface of said insulating film or said metal film;

forming at least one resist film on the at least two kinds of masks; and performing a plurality of etching works to said insulating film or said metal film in conformity with said at least two kinds of masks.

2. The manufacturing method according to claim 1, wherein said at least two kinds of mask are a hard mask and a carbon-containing mask, respectively.

3. The manufacturing method according to claim 2, wherein said hard mask is covered with said carbon-containing mask.

4. A manufacturing method of according to claim 2, wherein when said insulating film is to be worked, said hard mask to be employed is formed of an insulating film which is different from the first mentioned insulating film or a metal film; and when said metal film is to be worked, said hard mask to be employed is formed of an insulating film.

5. The manufacturing method of according to claim 2, wherein said carbon-containing film is formed of a material selected from the group consisting of a resist, a low dielectric constant insulating film, and carbon film.

6. A method of manufacturing a semiconductor device, which comprises the steps of:

forming an insulating film or a metal film on a surface of a semiconductor substrate;

forming a hard mask on a surface of said insulating film or said metal film;

forming a carbon-containing film on said insulating film or said metal film having said hard mask formed thereon, which is followed by a patterning work of said carbon-containing film, the resultant pattern of said carbon-containing film being subsequently employed as a mask to perform a first etching work of said insulating film or said metal film;

removing said patterned carbon-containing film, which is followed by a second etching work of said insulating film or said metal film with said hard mask being employed as a mask; and removing said hard mask.

7. The manufacturing method according to claim 4, wherein a metal film or a film of insulating material which differs from said insulating film is buried in said insulating film to be subjected to said etching work.

8. The manufacturing method according to claim 4, wherein said process of patterning said carbon-containing film comprises the steps of:

successively forming an SOG film and a resist film on a surface of said carbon-containing film;

patterning said resist film, and working said SOG film with said patterned resist film being employed as a mask; and etching said carbon-containing film with this worked SOG film being employed as a mask.

9. The manufacturing method according to claim 8, which further comprises a step of forming a reflection preventive film on said SOG film.

10. A method of manufacturing a semiconductor device, which comprises the steps of:

forming an insulating film on a surface of a semiconductor substrate;

forming a film of hard mask on a surface of said insulating film, and patterning said film of hard mask to obtain a hard mask;

forming a carbon-containing film on said insulating film having said hard mask formed thereon, which is followed by a patterning work of said carbon-containing film to remove part of said carbon-containing film which is located in a first region of said semiconductor substrate to thereby obtain a patterned carbon-containing film which is located in a second region of said semiconductor substrate, thereby forming a mask;

subjecting said insulating film to a first etching work with said hard mask of said first region and said mask of said second region being employed as a mask;

removing said carbon-containing film located in said second region; and subjecting said insulating films of said first and second regions to a second etching work with said hard mask being employed as a mask.

11. The manufacturing method according to claim 10, wherein said hard mask is formed of a film of an insulating material which is different from said insulating film or a metal film.

12. The manufacturing method according to claim 10, wherein said carbon-containing film is formed of a material selected from the group consisting of a resist, a low dielectric constant insulating film, and carbon film.

13. The manufacturing method according to claim 10, wherein a metal film is buried in said insulating film to be subjected to said etching work.

14. The manufacturing method according to claim 10, wherein said process of patterning said carbon-containing film comprises the steps of:

successively forming an SOG film and a resist film on a surface of said carbon-containing film;

patterning said resist film, and working said SOG film with said patterned resist film being employed as a mask; and etching said carbon-containing film with this worked SOG film being employed as a mask.

15. The manufacturing method according to claim 14, which further comprises a step of forming a reflection preventive film on said SOG film.

16. The manufacturing method according to claim 10, which further comprises a step of burying a metal film in the wiring grooves and contact holes which are formed in said first and second etching works.

17. A method of manufacturing a semiconductor device, which comprises the steps of:

forming a first insulating film on a surface of a semiconductor substrate;

forming a film of hard mask on a surface of said first insulating film, and patterning said film of hard mask to obtain a hard mask;

forming a carbon-containing film on said first insulating film having said hard mask formed thereon, which is followed by a patterning work of said carbon-containing film to form a mask;

subjecting said first insulating film to a first etching work with said mask of carbon-containing film being employed as a mask;

removing said mask of carbon-containing film;

subjecting said first insulating film to a second etching work with said hard mask being employed as a mask;

burying a metal film in the wiring grooves provided with contact holes and in said contact holes which are formed in said first and second etching works;

forming a second insulating film on said first insulating film in which said metal film is buried;

forming wiring grooves in said second insulating film, said wiring grooves allowing prescribed contact plugs that have been formed in said first insulating film to expose;

burying metal wirings in said wiring grooves formed in said second insulating film; and removing said hard mask.

18. The manufacturing method according to claim 17, wherein said patterning is performed in a manner to allow the wiring grooves and the contact holes to be disposed alternately.

19. The manufacturing method according to claim 17, wherein said carbon-containing film is formed of a material selected from the group consisting of a resist, a low dielectric constant insulating film, and carbon film.

20. The manufacturing method according to claim 17, wherein said process of patterning said carbon-containing film comprises the steps of:

successively forming an SOG film and a resist film on a surface of said carbon-containing film;

patterning said resist film, and working said SOG film with said patterned resist film being employed as a mask; and etching said carbon-containing film with this worked SOG film being employed as a mask.

21. The manufacturing method according to claim 20, which further comprises a step of forming a reflection preventive film on said SOG film.

22. A method of manufacturing a semiconductor device, which comprises the steps of:

forming an insulating film on a surface of a semiconductor substrate;

forming a metal film in a predetermined region of the insulating film;

forming a film of hard mask on the surfaces of said insulating film and said metal film, and patterning said film of hard mask to obtain a hard mask;

forming a carbon-containing film on said insulating film and said metal film each having said hard mask formed thereon, which is followed by a patterning work of said carbon-containing film to form a mask;

subjecting said insulating film to a first etching work with said mask of carbon-containing film being employed as a mask;

removing said mask of carbon-containing film; and subjecting said insulating film and said metal film to a second etching work with said hard mask being employed as a mask.

23. The manufacturing method according to claim 22, wherein a metal film is buried in said insulating film to be subjected to said etching work.

24. A method of manufacturing a semiconductor device, which comprises the steps of:
  forming an insulating film or a metal film on a surface of a semiconductor substrate;
  forming a film of hard mask on a surface of said insulating film or said metal film, and patterning said film of hard mask to form a hard mask in one of a region where a sparse pattern is to be formed and a region where a dense pattern is to be formed;
  forming a carbon-containing film over a surface of said insulating film or said metal film including said hard mask;
  forming a spin-on glass film over the carbon-containing film;
  forming a resist mask on the spin-on glass film under which said hard mask is not formed;
  etching said spin-on glass film using the resist mask as a mask to form a spin-on glass mask in the other of said region where a sparse pattern is to be formed and said region where a dense pattern is to be formed;
  etching said carbon-containing film using said spin-on glass mask as a mask to form a carbon-containing mask; and
  subjecting said insulating film or said metal film to an etching work with said hard mask and said carbon-containing mask being employed as a mask.

25. The manufacturing method according to claim 24, wherein a metal film or a film of insulating material which differs from said insulating film is buried in said insulating film to be subjected to said etching work.

26. A method of manufacturing a semiconductor device, which comprises the steps of:
  forming a film of gate electrode on an insulating film formed on a surface of a semiconductor substrate;
  forming a film of hard mask on a surface of said film of gate electrode, and patterning said film of gate electrode to form a hard mask in one of a region where gate is designed to be sparsely formed and a region where gate is designed to be densely formed;
  forming a carbon-containing film over said film of gate electrode having said hard mask formed thereon;
  forming a spin-on glass film over the carbon-containing film;
  forming a resist mask on the spin-on glass film under which said hard mask is not formed;
  etching said spin-on glass film using the resist mask as a mask to form a spin-on glass mask;
  etching said carbon-containing film using said spin-on glass mask as a mask to form a carbon-containing mask in the other of said region where gate is designed to be sparsely formed and said region where gate is designed to be densely formed;
  subjecting said film of gate electrode to an etching work with said hard mask and said carbon-containing mask being employed as a mask, thereby forming one of a dense gate region and a sparse gate region in said film of gate electrode in a region where said hard mask is formed, and at the same time, forming the other of the dense gate region and the sparse gate region in said film of gate electrode in a region where said carbon-containing mask is formed.

27. A method of manufacturing a semiconductor device, which comprises the steps of:
  forming an insulating film on a surface of a semiconductor substrate;
  forming a film of hard mask on a surface of said insulating film, and patterning said film of hard mask to form a hard mask in a region where an element isolation region is designed to be sparsely formed or in a region where an element isolation region is designed to be densely formed;
  forming a carbon-containing film on said insulating film having said hard mask formed thereon, which is followed by a patterning work of said carbon-containing film to form a mask in a region where said element isolation region is designed to be sparsely formed or in a region where said element isolation region is designed to be densely formed;
  subjecting said insulating film to an etching work with said hard mask and said mask being employed as a mask, thereby forming grooves in said semiconductor substrate;
  removing said hard mask and said mask;
  burying said element isolation film of dense pattern region or said element isolation film of sparse pattern region in the grooves of a region where said hard mask is formed, and at the same time, burying said element isolation film of dense pattern region or said element isolation film of sparse pattern region in the grooves of a region where said mask is formed.

28. A method of manufacturing a semiconductor device, which comprises the steps of:
  forming an insulating film or a metal film on a surface of a semiconductor substrate;
  forming a hard mask on a surface of said insulating film or said metal film;
  forming a carbon-containing film on said insulating film or said metal film having said hard mask formed thereon, which is followed by a patterning work of said carbon-containing film, the resultant pattern of said carbon-containing film being subsequently employed as a mask to perform a first etching work of said insulating film or said metal film; and
  removing said patterned carbon-containing film, which is followed by a second etching work of said insulating film or said metal film with said hard mask being employed as a mask,
  wherein a metal film or a film of insulating material which differs from said insulating film is buried in said insulating film to be subjected to said etching work.

29. A method of manufacturing a semiconductor device, which comprises the steps of:
  forming an insulating film or a metal film on a surface of a semiconductor substrate;
  forming a hard mask on a surface of said insulating film or said metal film
  forming a carbon-containing film on said insulating film or said metal film having said hard mask formed thereon, which is followed by a patterning work of said carbon-containing film, the resultant pattern of said carbon-containing film being subsequently employed as a mask to perform a first etching work of said insulating film or said metal film; and
  removing said patterned carbon-containing film, which is followed by a second etching work of said insulating film or said metal film with said hard mask being employed as a mask,
  wherein said process of patterning said carbon-containing film comprises:
    successively forming an SOG film and a resist film on a surface of said carbon-containing film;

patterning said resist film, and working said SOG film with said patterned resist film being employed as a mask; and etching said carbon-containing film with this worked SOG film being employed as a mask.

30. The manufacturing method according to claim 29, which further comprises a step of forming a reflection preventive film on said SOG film.

31. A method of manufacturing a semiconductor device, which comprises the steps of:

forming a first insulating film on a surface of a semiconductor substrate;

forming a film of hard mask on a surface of said first insulating film, and patterning said film of hard mask to obtain a hard mask;

forming a carbon-containing film on said first insulating film having said hard mask formed thereon, which is followed by a patterning work of said carbon-containing film to form a mask;

subjecting said first insulating film to a first etching work with said mask of carbon-containing film being employed as a mask;

removing said mask of carbon-containing film;

subjecting said first insulating film to a second etching work with said hard mask being employed as a mask;

burying a metal film in the wiring grooves provided with contact holes and in said contact holes which are formed in said first and second etching works;

forming a second insulating film on said first insulating film in which said metal film is buried;

forming wiring grooves in said second insulating film, said wiring grooves allowing prescribed contact plugs that have been formed in said first insulating film to be exposed; and burying metal wirings in said wiring grooves formed in said second insulating film, wherein said process of patterning said carbon-containing film comprises:

successively forming an SOG film and a resist film on a surface of said carbon-containing film;

patterning said resist film, and working said SOG film with said patterned resist film being employed as a mask; and etching said carbon-containing film with the worked SOG film being employed as a mask.

32. The manufacturing method according to claim 31, which further comprises a step of forming a reflection prevention film on said SOG film.

33. A method of manufacturing a semiconductor device, which comprises the steps of:

forming an insulating film or a metal film on a surface of a semiconductor substrate;

forming a film of hard mask on a surface of said insulating film or said metal film and patterning said film of hard mask to form a hard mask in a region where a sparse pattern is to be formed or in a region where a dense pattern is to be formed;

forming a carbon-containing film on a surface of said insulating film or said metal film where said hard mask is not formed, which is followed by a patterning work of said carbon-containing film to form a mask in said region where a sparse pattern is to be formed or in said region where a dense pattern is to be formed; and subjecting said insulating film or said metal film to an etching work with said hard mask and said mask being employed as a mask, wherein a metal film or a film of insulating material which differs from said insulating film is buried in said insulating film to be subjected to said etching work.

34. A method of manufacturing a semiconductor device, which comprises the steps of:

forming an insulating film on a surface of a semiconductor substrate;

forming a film of hard mask on a surface of said insulating film, and patterning said film of hard mask to form a hard mask in a region where wirings are to be sparsely patterned or in a region where wirings are to be densely patterned;

forming a carbon-containing film on said insulating film having said hard mask formed thereon, which is followed by a patterning work of said carbon-containing film to form a mask in said region where wirings are to be sparsely patterned or in said region where wirings are to be densely patterned;

subjecting said insulating film to an etching work with said hard mask and said mask being employed as a mask, thereby forming wiring grooves;

removing said hard mask and said mask;

forming wirings of dense pattern region or of sparse pattern region in the wiring grooves in a region where said hard mask is formed, and at the same time, forming wirings of dense pattern region or of sparse pattern region in the wiring grooves in a region where said mask is formed.

35. The manufacturing method according to claim 34, wherein in a case where said insulating film is to be worked, said hard mask is formed of an insulating film which differs in kind from the first mentioned insulating film.

36. The manufacturing method according to claim 34, wherein said carbon-containing film is formed of a material selected from the group consisting of a resist, a low dielectric constant insulating film, and carbon film.

37. The manufacturing method according to claim 34, wherein said process of patterning said carbon-containing film comprises the steps of:

successively forming an SOG film and a resist film on a surface of said carbon-containing film;

patterning said resist film, and working said SOG film with said patterned resist film being employed as a mask; and etching said carbon-containing film with this worked SOG film being employed as a mask.

38. The manufacturing method according to claim 37, which further comprises a step of forming a reflection preventive film on said SOG film.

* * * * *

UNITED STATES PATENT AND TRADEMARK OFFICE
CERTIFICATE OF CORRECTION

PATENT NO.    : 6,627,557 B2                                  Page 1 of 1
DATED         : September 30, 2003
INVENTOR(S)   : Seta et al.

It is certified that error appears in the above-identified patent and that said Letters Patent is hereby corrected as shown below:

<u>Title page,</u>
Item [57], ABSTRACT,
Line 4, change "two kinds of mask" to -- two kinds of masks --;
Line 7, change "various kinds of mask." to -- various kinds of masks. --.

<u>Column 26,</u>
Line 25, change "two kinds of mask" to -- two kinds of masks --.
Lines 30 and 36, change "method of" to -- method --.
Lines 59 and 63, change "claim 4," to -- claim 6, --.

<u>Column 30,</u>
Line 52, change "said metal film" to -- said metal film; --.

<u>Column 31,</u>
Line 57, change "said metal film" to -- said metal film, --.

Signed and Sealed this

Twentieth Day of January, 2004

JON W. DUDAS
*Acting Director of the United States Patent and Trademark Office*